United States Patent
Yu

(10) Patent No.: US 11,740,274 B2
(45) Date of Patent: Aug. 29, 2023

(54) PHASE IDENTIFICATION IN POWER DISTRIBUTION SYSTEMS

(71) Applicant: The Regents of the University of California, Oakland, CA (US)

(72) Inventor: Nanpeng Yu, Walnut, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 1092 days.

(21) Appl. No.: 16/323,493

(22) PCT Filed: Aug. 4, 2017

(86) PCT No.: PCT/US2017/045589
§ 371 (c)(1),
(2) Date: Feb. 5, 2019

(87) PCT Pub. No.: WO2018/027180
PCT Pub. Date: Feb. 8, 2018

(65) Prior Publication Data
US 2021/0285994 A1 Sep. 16, 2021

Related U.S. Application Data

(60) Provisional application No. 62/371,381, filed on Aug. 5, 2016.

(51) Int. Cl.
*H02J 13/00* (2006.01)
*G01R 19/25* (2006.01)
(Continued)

(52) U.S. Cl.
CPC ......... *G01R 29/18* (2013.01); *G01R 19/2503* (2013.01); *G01R 19/2513* (2013.01);
(Continued)

(58) Field of Classification Search
CPC ............... G01R 29/18; G01R 19/2503; G01R 19/2513; G05B 23/0254; G06F 16/355;
(Continued)

(56) References Cited

U.S. PATENT DOCUMENTS 9,008,329 B1 4/2015 Mandel et al.
9,292,794 B2 * 3/2016 Arya ...................... G06N 20/00
(Continued)

FOREIGN PATENT DOCUMENTS

CA 2711994 C * 9/2014 ............. G01D 4/004
DE 235338 A1 * 4/1986

OTHER PUBLICATIONS

S. Haven and et al, "Analysis and Clustering of Residential Customers Energy Behavioral Demand Using Smart Meter Data", IEEE Transactions on Smart Grid, vol. 7, No. 1, Jan. 2016 (Year: 2016).*
(Continued)

*Primary Examiner* — Douglas Kay
(74) *Attorney, Agent, or Firm* — Schwegman Lundberg & Woessner, P.A.

(57) ABSTRACT

Techniques for phase identification using feature-based clustering approaches are disclosed. Embodiments employ linear and nonlinear dimensionality reduction techniques to extract feature vectors from raw time series. In an embodiment, a constrained clustering algorithm separates smart meters into phase connectivity groups. Another embodiment clusters smart meter data, where voltage measurements are collected from smart meters and a SCADA system. Then, customer voltage time series are normalized and linear or nonlinear dimensionality reduction is applied to the normalized time series to extract key features. Next, constraints in the clustering process are defined by inspecting network connectivity data. Then, a constrained clustering method is applied to partition customers into clusters. Lastly, each
(Continued)

clusters phase is identified by solving a minimization problem. In another embodiment, a machine learning algorithm generalizes a subset of phase connectivity measurements to a distribution network, the algorithm being an extension of a Mapper algorithm in topological data analysis.

13 Claims, 15 Drawing Sheets

(51) Int. Cl.
| | |
|---|---|
| *G06F 17/18* | (2006.01) |
| *G01R 29/18* | (2006.01) |
| *G06N 20/20* | (2019.01) |
| *G06N 20/10* | (2019.01) |
| *G06F 16/35* | (2019.01) |
| *G05B 23/02* | (2006.01) |
| *G06N 5/04* | (2023.01) |
| *H02J 3/26* | (2006.01) |
| *G06N 99/00* | (2019.01) |

(52) U.S. Cl.
CPC ....... *G05B 23/0254* (2013.01); *G06F 16/355* (2019.01); *G06F 17/18* (2013.01); *G06N 5/04* (2013.01); *G06N 20/10* (2019.01); *G06N 20/20* (2019.01); *H02J 3/26* (2013.01); *H02J 13/00001* (2020.01); *H02J 13/00002* (2020.01); *G06N 99/00* (2013.01)

(58) Field of Classification Search
CPC .. G06F 17/18; G06F 1/26; G06N 5/04; G06N 20/10; G06N 20/20; G06N 99/00; H02J 3/26; H02J 13/00001; H02J 13/00002; Y02B 90/20; Y04S 20/00
See application file for complete search history.

(56) References Cited

U.S. PATENT DOCUMENTS

| | | | |
|---|---|---|---|
| 9,395,398 B2* | 7/2016 | Kitajima | G01R 29/18 |
| 2007/0063664 A1* | 3/2007 | Rhodes | G01R 29/18 |
| | | | 318/400.21 |
| 2009/0098515 A1 | 4/2009 | Das et al. | |
| 2010/0198900 A1* | 8/2010 | Gifford | G06K 9/6254 |
| | | | 702/179 |
| 2012/0074779 A1 | 3/2012 | Black et al. | |
| 2012/0221265 A1 | 8/2012 | Arya et al. | |
| 2013/0049732 A1 | 2/2013 | Kulkarni et al. | |
| 2015/0052088 A1* | 2/2015 | Arya | H02J 3/00 |
| | | | 706/12 |
| 2015/0058653 A1 | 2/2015 | Blayvas | |
| 2015/0241490 A1* | 8/2015 | Kitajima | G01R 29/18 |
| | | | 324/76.77 |
| 2016/0109491 A1* | 4/2016 | Kann | G01R 29/18 |
| | | | 702/64 |

OTHER PUBLICATIONS

I. T. Jolliffe and J. Cadima, "Principal component analysis: a review and recent developments", Philosophical Transactions of the royal society publishing, Jan. 2016, Phil. Trans. R. Soc. A 374:20150202. http://dx.doi.org/10.1098/rsta.2015.0202 (Year: 2016).*
H. Salazar and et al., "Artificial Neural Networks and Clustering Techniques Applied in the Reconfiguration of Distribution Systems", IEEE Transactions on Power Delivery, vol. 21, No. 3, Jul. 2006 (Year: 2006).*
"International Application Serial No. PCT US2017 045589, International Preliminary Report on Patentability dated Feb. 14, 2019", 9 pages.
International Application Serial No. PCT/US2017/045589, International Search Report dated Nov. 27, 2017, 4 pgs.
International Application Serial No. PCT/US2017/045589, Invitation to Pay Add'l Fees and Partial Search Report dated Sep. 11, 2017, 2 pgs.
International Application Serial No. PCT/US2017/045589, Written Opinion dated Nov. 27, 2017, 7 pgs.

* cited by examiner

PHASE IDENTIFICATION IN POWER DISTRIBUTION SYSTEMS

PRIORITY CLAIM

This application is a U.S. National Stage Filing under 35 U.S.C. 371 from International Application No. PCT/US2017/045589, filed on Aug. 4, 2017, and published as WO 2018/027180 A1 on Feb. 8, 2018, which claims the benefit of priority to U.S. Provisional Patent Application No. 62/371,381 entitled "Phase Connectivity Identification in Electric Power Distribution System with Smart Meter Data", filed Aug. 5, 2016, each of which is incorporated herein by reference in its entirety.

TECHNICAL FIELD

Embodiments pertain to power distribution networks and phase identification. Some embodiments relate to techniques for phase identification, where the phase identification problem is defined as identifying the phase connectivity of each customer and structure in a power distribution network.

BACKGROUND

Driven by stricter environmental regulations, technological advances, and business model innovations, distributed energy resources (DERs) are being deployed in the electric power distribution system at an unprecedented pace. DERs may include renewable energy sources for supply of power via an energy distribution network, such as, for example an electric distribution system or electric grid. To fully exploit the benefits of distributed energy resources (DERs), energy distribution networks must be actively managed. To operate the distribution system in an efficient and reliable manner, distribution system operators typically rely on a set of tools and applications including three-phase power flow, distribution system state estimation, three-phase optimal power flow, distribution system restoration, distribution network reconfiguration, etc. However, all of these applications require an accurate distribution network and phase connectivity model. Although the network connectivity model is mostly accurate, phasing errors are common. Therefore, accurate phase identification methods are needed.

BRIEF DESCRIPTION OF THE DRAWINGS

In the following detailed description of example embodiments of the invention, reference is made to the accompanying drawings which form a part hereof, and which is shown by way of illustration only, specific embodiments in which the invention may be practiced. It is to be understood that other embodiments may be utilized and structural changes may be made without departing from the scope of the present invention.

The present disclosure is illustrated by way of example and is not limited to the figures of the accompanying drawings, in which like references indicate similar elements and in which.

DETAILED DESCRIPTION

Figure 1:
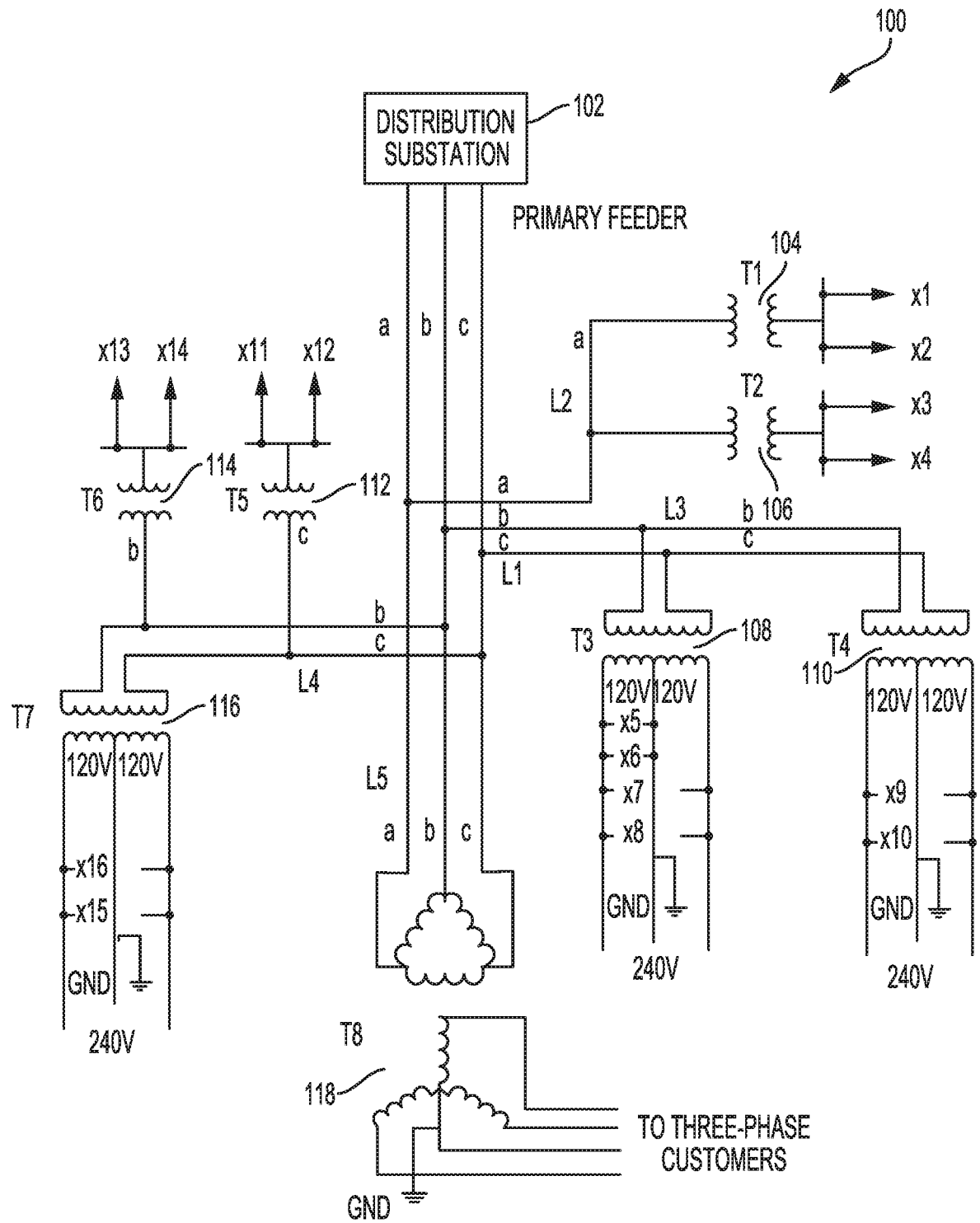
FIG. 1 illustrates a simple electric distribution system in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Accurate network and phase connectivity models are crucial to distribution system analytics, operations and planning. Although network connectivity information is mostly reliable, phase connectivity data is typically missing or erroneous. In the present disclosure, an innovative phase identification algorithm is presented. In some embodiments, the phase identification algorithm is developed by clustering of voltage time series gathered from smart meters. A smart meter is a utility meter device which is capable of measuring a metered quantity, typically a commodity like electricity, water, natural gas, etc.

Smart meters are used with Automated Meter Reading systems to provide services and capabilities to monitor and/or report the usage (or consumption) of a commodity, such as water, electricity, gas, etc. Such systems provide communication between a commodity meter (e.g., a smart meter) and one or more systems to report commodity usage, bill, etc. Commodity metering information, as well as other information, is typically reported from the network devices associated with the smart meters to reporting and billing systems. Automatic meter reading may automatically collect data from smart metering devices (e.g., a smart gas meter, a smart electricity meter) and/or transfer the data to a central database for analyzing the data. The automatic meter reading may include handheld, mobile and/or network technologies based on telephony platforms (e.g., wired and wireless), radio frequency (RF), and/or powerline transmission, or dedicated, land-line connectivity such as the Ethernet.

The network technologies of the automatic meter reading may be based on a network (e.g., a network for an electric distribution system having a plurality of smart meters) permanently installed to capture and/or transfer the data. The network may also include other devices (e.g., antennas, towers, collectors, repeaters, and/or other permanently installed infrastructure) to transfer (e.g., automatically) the data collected from a plurality of metering devices (e.g., smart meters) to the central database of a server (e.g., which oversees the metering devices and the other devices).

In certain embodiments, the feature-based clustering approach is adopted where linear or nonlinear dimensionality reduction is first carried out to extract feature vectors from a raw time series. A constrained or unconstrained clustering algorithm is then executed to separate customers (e.g., smart meters associated with customers) into various phase connectivity groups. In one example, the algorithm is applied on a real distribution feeder in a power utility (e.g., an electrical utility) service territory. As disclosed herein, the accuracy of the proposed algorithm is over 90%. Embodiments employ clustering, data mining, phase identification, dimensionality reduction techniques, and smart meter data.

Electric utility companies typically do not have accurate phase connectivity information. Moreover, the phase connectivity of the distribution network changes over time when new customers are connected to the system. With more DERs connected to the power distribution system, correct phase connectivity data become increasingly important to efficient and reliable operations of power distribution systems. The present disclosure develops an unsupervised machine learning algorithm to identify the phase connectivity of customers based on smart meter data and supervisory control and data acquisition (SCADA) data.

Embodiments provide phase identification solutions that are unavailable using existing, traditional approaches and techniques. Very few studies on phase identification have been carried out. Existing techniques for solving the phase identification problem may be categorized into two general approaches. In the first approach, only smart meter data and SCADA information are assumed to be available. In the second approach, special equipment such as microsynchrophasors, signal generators and discriminators need to be installed to accurately identify the phase of distribution system customers and/or structures.

In the first approach, 0-1 integer linear programming and correlation-based methods are proposed to solve the phase identification problem. The phase identification problem is formulated as a 0-1 integer linear programming problem where the phase connection of smart meters are treated as binary variables. Tabu search and branch and bound search are used to solve the integer optimization problem.

In correlation-based methods, correlation coefficients or $R^2$ (coefficient of determination) are calculated between the voltage profile of individual smart meters and the voltage profile of the substation on each phase. These correlation coefficients or $R^2$ are assumed to have the highest value when the customer's phase is correctly labeled.

In the second approach, microsynchrophasors, signal generators, and discriminators are leveraged to accurately identify the phase of each customer. In one example of this second approach, microsynchrophasors are deployed at the target bus for phase identification. Microsynchrophasors can measure voltage phase angles in addition to voltage magnitude. The main idea behind the method is that the correct customer phase label should yield the highest voltage magnitude and phase correlation with the corresponding phase at the substation. A benefit of the micro-synchrophasor approach is that the method is applicable to all types of customer phase connections. In another example of this second approach, a signal generator is deployed at the distribution substation and signal discriminators are deployed at the target customer sites to accurately identify the phases of smart meters.

There are two drawbacks associated with the existing 0-1 integer programming method. The first drawback is its computational complexity. A typical distribution feeder serves 1000 to 3000 customers on average. Therefore, the 0-1 integer programming problem for phase identification has thousands of binary decision variables, which requires daunting computational time. The second drawback is its low tolerance for erroneous and missing measurements. The existing methods only work when there are no unmetered loads or erroneous load measurements.

Although existing correlation-based methods may be effective in identifying single-phase customers, such traditional methods may not be able to be successfully applied in the distribution circuits where the majority of the loads are two-phase. In addition, the algorithm used by such methods may incorrectly label customers on the same single-phase secondary differently.

One disadvantage of traditional methods in the second approach noted above is the expensive capital and maintenance costs for the additional equipment.

Example Electric Power Distribution System

FIG. 1 illustrates a simple electric distribution system 100 in accordance with some embodiments. To understand the phase identification problem, a brief description of an electric power distribution system is provided with reference to FIG. 1. As would be understood by one skilled in the relevant art(s), the electric power distribution system is the final portion of the power delivery infrastructure that carries electricity from highly interconnected, high-voltage transmission systems to end-use customers. An illustration of a simple electric distribution system 100 is depicted in FIG. 1. The starting point of the distribution system 100 is the distribution substation 102. In the distribution substation 102, a step-down transformer lowers the transmission-level voltage (35 to 230 kV) to a medium-level voltage (4 to 35 kV) in the primary distribution circuits. The electric power then flows through the primary feeders (a, b, and c) and laterals (L1-L5) to distribution transformers (T1—104, T2—106, T3—108, T4—110, T5—112, T6—114, T7—116, and T8—118), which further step down the voltage to low-voltage secondary circuits. The secondary circuits serve end-use customers and operate at 120/240V single-phase, 120/208 V three-phase, or 277/480V three-phase. Laterals may be single-phase (L2), two-phase, also called "V" phase (L3, L4), or three-phase (L1, L5).

The majority of the electric power is supplied by three-phase generators. In balanced conditions, the electric power circuits are three-phase circuits and the three voltage phasors, $V_{an}$, $V_{bn}$, and $V_{cn}$, differ only in their angles, with 120-degree differences between any pair. Residential customers may be served by either a 120/240V three-wire secondary through a center-tapped transformer (e.g., T3—108, T4—110, T7—116) or a 120V single-phase secondary through a single-phase transformer (e.g., T1—104, T2—106, T5—112, T6—114). Commercial customers are typically served by a 208 V or 480V three-phase four-wire secondary through a three-phase transformer (e.g., T8—118).

The phase identification problem is defined as identifying the phase connectivity of each customer and structure in the power distribution network.

Very few studies on phase identification have been carried out. Existing methods for solving the phase identification problem may be separated into two general approaches. In the first approach, only smart meter data and SCADA information are assumed to be available. In the second approach, special equipment such as microsynchrophasors, signal generators, and discriminators need to be installed to accurately identify the phase of distribution system customers and/or structures.

Figure 2:
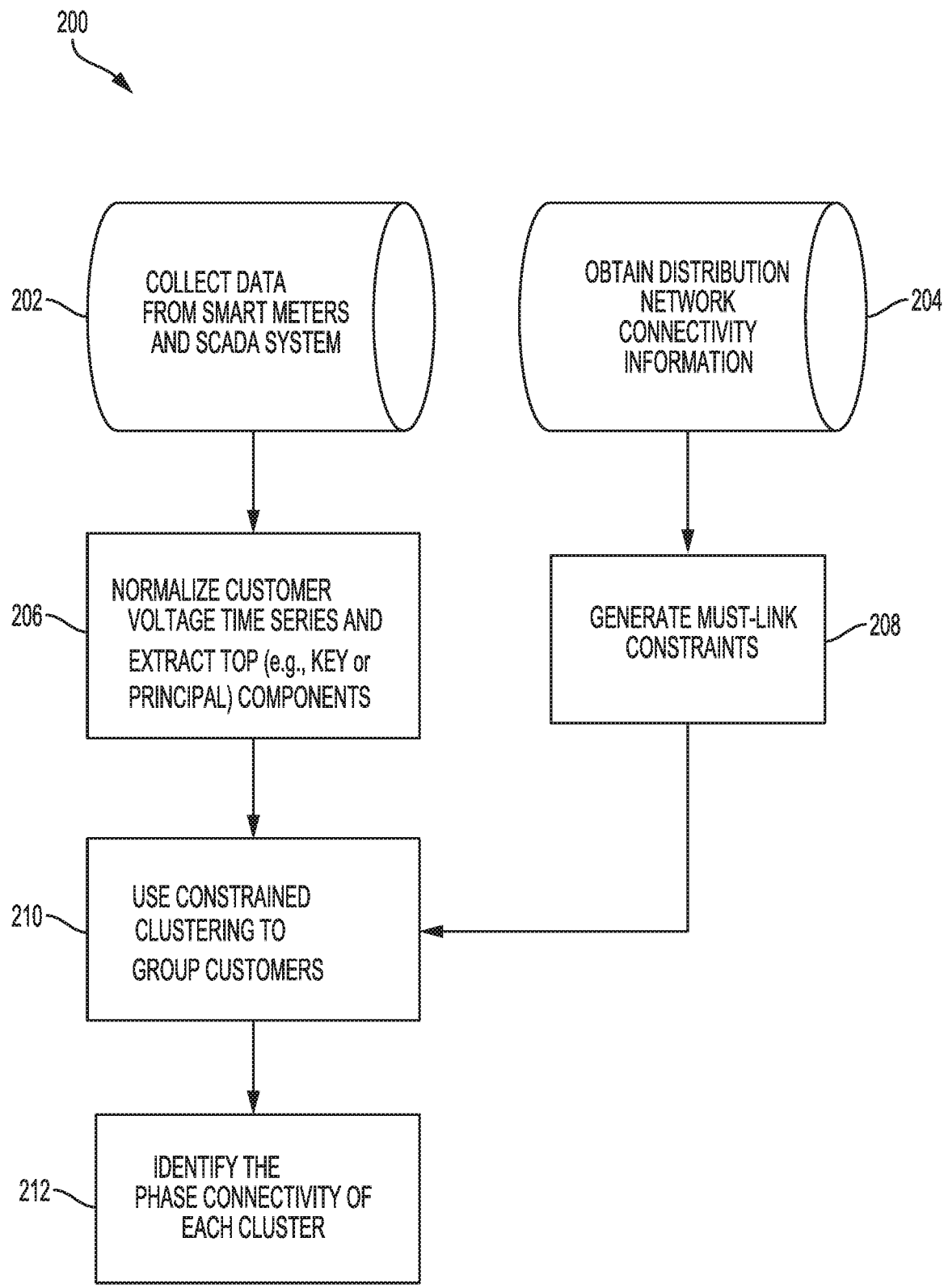
FIG. 2 is a flowchart illustrating a method for phase identification in accordance with some embodiments.

Example Methods for Phase Identification in Electric Power Distribution Systems by Clustering of Smart Meter Data FIG. 2 is a flowchart illustrating a method 200 for phase identification in accordance with some embodiments. A framework of embodiments disclosed herein performs phase identification algorithm by clustering smart meter data. In particular, the operations of method 200 perform phase identification by clustering smart meter data.

At operation 202, voltage measurements are collected from smart meters and the SCADA system.

At operation 204, distribution connectivity information is obtained. In an embodiment, operation 204 may include retrieving distribution connectivity information from an entity (e.g., an electrical power utility) operating an electric distribution system, such as, for example the electric distribution system 100 shown in FIG. 1.

At operation 206, customer voltage time series are normalized by their standard deviations. In the example of FIG. 2, operation 202 includes applying linear and non-linear dimensionality reduction techniques. Various dimensionality reduction techniques, such as, for example, principal component analysis (PCA), Sammon mapping, curvilinear components analysis, Isomap, and t-distributed stochastic neighbor embedding may be leveraged to extract key features from the voltage time series at operation 206. For example, operation 206 can include applying PCA on the normalized time series to extract the top n components.

At operation 208, constraints in the clustering process are defined by inspecting the network connectivity data obtained in operation 204.

At operation 210, a constrained clustering method is then applied to partition customers into clusters. In certain embodiments, operation 210 may include applying a centroid based or density based constrained clustering method to partition customers into clusters. In alternative or additional embodiments, operation 210 may include applying a k-means constrained clustering method.

Then, at operation 212, the phase of each cluster is identified by solving a minimization problem. Operation 212 can identify the phase of each cluster by solving the minimization problem.

The phase identification method 200 can include using an algorithm utilizing the known information about line configurations in the network connectivity model to avoid mislabeling the customers on the same secondary feeder which can occur in the existing methods. In some embodiments, an example phase identification algorithm is computationally efficient and more accurate than a 0-1 integer linear programming method and correlation-based methods. For example, a phase identification algorithm may be used in embodiments that is less expensive than approaches where special equipment needs to be installed in an electric power distribution system, such as, for instance, an electric power distribution system similar to the electric distribution system 100 shown in FIG. 1.

In certain embodiments, an innovative constrained clustering algorithm of smart meter data is proposed to solve the phase identification problem. Instead of directly using the voltage time series data, certain embodiments first extract unique features from the voltage time series of smart meters. Then, certain embodiments define customer phase constraints by exploiting the known information about line configurations in the network connectivity model. At last, constrained and unconstrained clustering algorithms may be applied to accurately identify the phase connection of each customer. In one non-limiting example, a constrained k-means clustering algorithm may be applied to identify the phase connection of each customer.

Unique features of certain embodiments are as follows: 1. An example phase identification algorithm utilizes known information about line configurations in the network connectivity model to avoid mislabeling the customers on the same secondary feeder which can occur in the existing methods. 2. The example phase identification algorithm is computationally efficient compared with the 0-1 integer linear programming method and the correlation-based methods.

As noted above with reference to FIG. 2, the framework of an example phase identification algorithm clusters smart meter data.

In some embodiments, the method 200 includes clustering time series data. One goal of clustering is to identify the structure in an unlabeled dataset by objectively organizing data into homogeneous groups such that the objects in the same group are more similar to each other than those in different groups. Various algorithms have been developed to cluster time series data. One clustering algorithm is k-means, in which the objects are divided into k clusters so that the within-cluster sum of squares is minimized. Though typically it is not practical to find the minimal sum of squares among all partitions, it is practical to find local optimal solutions using this algorithm.

Many clustering algorithms require a similarity or distance function. There are many different types of distance functions. Embodiments consider two such distance functions. The first one is Euclidean distance. If $a_i$ and $a_j$ are two P-dimensional time series data points, then their Euclidean distance is defined by $$d_E = \sqrt{\sum_{k=1}^{P}(a_{ik} - a_{jk})^2} \quad (1)$$

Another type of distance function is related to Pearson's correlation coefficient. For two P-dimensional time series data points $a_i$ and $a_j$, their Pearson's correlation factor is defined by $$cc = \frac{\sum_{k=1}^{P}(a_{ik} - \mu_i)(a_{jk} - \mu_j)}{s_i s_j} \quad (2)$$

where $\mu_i$ and $\mu_j$ are the mean values of $a_i$ and $a_j$, and $s_i$ and $s_j$ are the scatters of $a_i$ and $a_j$, i.e., $s_i = \sqrt{\sum_{k=1}^{P}(a_{ik}-\mu_i)^2}$ Then the distance between $a_i$ and $a_j$ may be defined based on cc as $$d_1 = 1 - cc \text{ or } d_2 = \left(\frac{1-cc}{1+cc}\right)^\beta, (\beta > 0).$$

Smart meter time series data are high-dimensional. It is not desirable to work with high-dimensional noisy raw data in practice. Therefore, certain embodiments adopt a feature-based clustering method for the phase identification problem. Drawing features from data often requires expert knowledge of the data, but in the phase identification problem, little knowledge exists regarding what features are important. PCA is a useful tool to reduce the data dimension and extract key features hidden in the time series data. PCA transforms a dataset into a new set of uncorrelated variables called principal components (PCs). PCs are ordered such that the first component retains the most of the variation in the original variables, the second component retains the second most of the variation, and so on. In certain embodiments, PCA may be used to select the most important features of the voltage time series data by picking the first n components. Euclidean distance in the chosen principal components' space will be used as the distance metric in the subsequent clustering process.

Clustering of Smart Meter Data with Constraints

The intuition behind identifying phase connectivity through clustering of voltage time series data is that the distribution system is typically operated in an unbalanced manner. The unbalanced impedances and electric loads on three phases lead to unbalanced line currents and voltages. This implies that the trajectory of voltage time series of customers with the same phase connectivity will have more similar behavior than those with different phase connectivity. As mentioned above, instead of working directly with the raw voltage data, in some embodiments, a feature-based clustering approach is adopted with features extracted from the voltage time series by PCA. Preprocessing, including normalization and centering of the raw voltage data, is conducted before applying PCA. As shown in the case study herein, a relatively small number of features can yield very accurate clustering results.

One goal of clustering the voltage data from smart meters is to identify distinct groups of customers such that all customers in the same group have the same phase connectivity. Using the distribution feeder shown in FIG. 1 as an example, customers x7, x8, x9, x10, x15 and x16 are all connected to phase BC through a single-phase three-wire system (120/240V), and they should be clustered into the same group. Similarly, consumers x1, x2, x3 and x4 should also be in one cluster because they are all connected to phase A and have the same voltage level (120V).

Before applying the clustering algorithm, some embodiments first separate customers based on their service voltage levels (120V, 120/240V, 208 V, 277V, 480V). These voltage levels may be easily identified by inspecting the voltage magnitude data from smart meters. The algorithm used in some embodiments aims at clustering customers of the same voltage level. For example, if there is a set of 120/240V meters, then the meters need to be clustered into three groups. This is because 120/240V single-phase three-wire service has three possible phase connections: AB, BC, and CA.

Various studies have been carried out to attempt to improve clustering/learning performances by utilizing constraints from background knowledge. In one such study, two kinds of hard constraints are introduced: must-link constraints and cannot-link constraints. Must-link constraints specify that two data points have to be in the same cluster; cannot-link constraints specify that two data points cannot be in the same cluster.

As shown in the example of FIG. 2, at operation 208, the constraints for the phase identification problem may be formed based on the network connectivity information obtained at operation 204. Such network connectivity information is typically available for power distribution systems, such as, for example, the electric power distribution system 100 shown in FIG. 1. The network connectivity information obtained at operation 204 may include line segment configurations and the connectivity between customers, distribution transformers, laterals, and primary feeders. If two customers are connected to the same secondary laterals and have the same voltage level, then they have the same phase connectivity and should be linked together in the clustering process. For example, with reference to FIG. 1, customers x7, x8, x9 and x10 are all connected to the same lateral L3, and receive power through a three-wire single-phase (120/240V) configuration. Therefore, these customers should be grouped into the same cluster. However, customers 7 and x15 should not be linked to each other because they are connected to different laterals.

In another study, a scheme is introduced for constrained k-means clustering. This scheme is similar to the basic k-means clustering algorithm except that in the constrained clustering algorithm, each data point is assigned to the closest cluster such that it does not violate the constraints. The phase identification problem has must-link constraints where certain data points must be in the same cluster. In certain embodiments, first, customers on the same laterals are put into a subset. Then, an augmented k-means clustering algorithm is performed to the subsets themselves to obtain the full partition. Let $D=D_1 \cup D_2 \cup \ldots \cup D_n$ be the whole dataset, and $D_1, \ldots, D_n$ are the subsets in which every data point is linked together by the constraints. If a data point is not linked to any other data point, then it forms a subset in D itself. The constrained k-means clustering algorithm for phase identification is described in Algorithm 1 below.

Embodiments overcome issues with the difficulty of finding optimal result(s) by k-means clustering. For instance, to get a relatively good clustering result in example approaches, the clustering algorithm is performed multiple times with different sets of random initial cluster centers. The clustering result with the smallest sum of squared distances is selected in the end.

Algorithm 1 Constrained k-means clustering algorithm
1: procedure CON-K-MEANS($D=D_1 \cup D_2 \cup \ldots \cup D_n$)
2: Choose data points randomly from D as the initial cluster centers $C_1, \ldots, C_k$.
3: For each subset $D_i$, assign it to the closest cluster $C_j$. The closest cluster is the cluster that has the minimum sum of squared distances with all the data points in $D_i$.)
4: For each cluster update its center by averaging all the data points that have been assigned to it.
5: Iterate between (3) and (4) until convergence.
6: return $\{C_1, \ldots, C_k\}$.
7: end procedure Identifying the Phase of Cluster Once the customers are clustered as described above with reference to the method 200 of FIG. 2, an additional step is to identify the phase of each cluster. Since the customers in the same cluster should have the same phase connection, an embodiment can identify the phase of each cluster by picking a small number of customers from that cluster and identifying their phase connectivity. This is a huge workload reduction compared with performing phase identification algorithms on every single customer. One may identify the phase of these few customers by microsynchrophasors, signal generators, and discriminators.

However, to further reduce the computational workload, and to save the expense of equipment needed with traditional approaches, certain embodiments identify the phase of each cluster by a one-to-one matching between the set of clusters and the set of possible phase connections. The one-to-one matching may be found by solving the following minimization problem. Suppose there are K clusters to be identified with centers $C_1, \ldots, C_K$, and there are K substation voltage time series on the K possible phases. The K substation voltage series are centered and normalized by their standard deviations, and then projected onto the chosen principal components' space used for clustering. Let $V_1, \ldots, V_K$ be the coordinates of the K voltage series in the chosen principal components' space, and let $f$: $(C_1, \ldots, C_K) \rightarrow \{V_1, \ldots, V_K\}$ be an unknown bijection between the cluster set and the substation voltage set. The solution of the minimization in (3) is the one-to-one matching for phase identification. The phase of each cluster's paired voltage data is the cluster's identified phase.

$$\underset{\forall \text{bijection } f:\{C_1,\ldots,C_K\}\rightarrow\{V_1,\ldots,V_K\}}{\operatorname{argmin}} \sum_{i=1}^{K} d_E(C_i, f(C_i))^2$$

Here, $d_E(C_i, f(C_i))$ is the Euclidean distance between $C_i$ and $f(C_i)$. The minimization may be solved by exhaustive search, because there are only K! possible bijections, where K is small (e.g., K=3 at 120/240V level).

Example Results Based on Electric Power Utility Distribution Feeder

In this section, the proposed phase identification method is validated through a case study of a distribution feeder in a power utility's service territory. The results show that the constrained k-means clustering algorithm yields highly accurate phase connectivity on a typical distribution feeder.

Description of Datasets and Preprocessing of Data

The distribution feeder used for case study is a 12.47 kV network with a peak load of about 5.2 MW. The feeder serves about 1500 customers. The majority of the customers are residential customers.

The raw data collected to test the phase identification algorithm include: 1) hourly smart meter readings of voltages; 2) feeder line-to-line voltage readings of three phases from the SCADA system; 3) network connectivity of the distribution system. The SCADA system only records new feeder measurements when the difference between the new measurement and the previous measurement exceeds a certain threshold. For example, the threshold setting for the line-to-line voltage is 0.02 kV. At last, to evaluate the accuracy of the proposed phase identification method, the correct phase connectivity of each meter is also gathered to serve as the ground truth.

Since the SCADA readings are recorded at non-uniform timestamps, linear interpolation is used to create a new set of voltages that have the same timestamps as the smart meter readings. All the readings are centered and normalized by their standard deviations. PCA and k-means clustering are performed on time series data of the same time period with the same timestamps. The timestamps are chosen such that most meters have a complete set of measurements. A smart meter is removed from the case study if it has missing readings at the chosen timestamps in the study period. In the testing distribution feeder, most of the customers are served by a three-wire single-phase system (120/240V) based on the smart meter voltage levels. A few customers are served by three-phase laterals; there is no need to perform phase identification for these customers. Less than 1% of the customers are served by two-wire single-phase systems (120V). Due to the small number of datasets, they are removed from the clustering process and their phase connectivity may be identified.

After preprocessing the test data, about 1500 customers/meters need to be clustered into three groups: phase AB, phase BC, and phase CA. PCA may be conducted on the preprocessed time series data. In certain embodiments, only the first two principal components are used to calculate Euclidean distances among customers. Based on the simulation results, including additional principal components does not further improve the performance of the phase identification results. The phase of each cluster may be identified by finding the bijection as described above with reference to FIG. 2. In this case, the bijection is between three clusters and the substation voltages of phase AB, BC and CA.

Example Clustering Results

TABLE I

Example Clustering Results

| Cluster | Identified Phase | Number of Meters | Accuracy | Overall Accuracy |
|---|---|---|---|---|
| Unconstrained Clustering Results of August 2015 | | | | |
| 1 | AB | 674 | 92.58% | |
| 2 | BC | 518 | 87.64% | 87.55% |
| 3 | CA | 246 | 73.58% | |
| Constrained Clustering Results of August 2015 | | | | |
| 1 | AR | 636 | 98.27% | |
| 2 | BC | 560 | 87.68% | 90.40% |
| 3 | CA | 242 | 76.03% | |
| Unconstrained Clustering Results of September 2015 | | | | |
| 1 | AB | 678 | 93.36% | |
| 2 | BC | 547 | 93.60% | 93.12 |
| 3 | CA | 244 | 91.39% | |
| Constrained Clustering Results of September 2015 | | | | |
| 1 | AB | 645 | 98.29% | |
| 2 | BC | 559 | 97.67% | 97.28% |
| 3 | CA | 265 | 93:96% | |
| Unconstrained Clustering Results of October 2015 | | | | |
| 1 | AB | 662 | 95.02% | |
| 2 | BC | 531 | 93.60% | 93.09% |
| 3 | CA | 254 | 87.01% | |
| Constrained Clustering Results of October 2015 | | | | |
| 1 | AB | 630 | 99.84% | |
| 2 | BC | 550 | 98.36% | 97.86% |
| 3 | CA | 267 | 92.13% | |

In the example results, three months of SCADA, smart meter, and network connectivity data are collected from Aug. 1, 2015 to Oct. 31, 2015. 1438 smart meters' data are available in August. Of these smart meters, 629 of them are connected to phase AB laterals, 557 of them are connected to phase BC laterals, and 252 of them are connected to phase CA laterals. In September, 1469 smart meters' data are available. Of these smart meters, 638 of them are connected to phase AB laterals, 571 of them are connected to phase BC laterals, and 260 of them are connected to phase CA laterals. In October, 1447 smart meters' data are available. Of these smart meters, 633 of them are connected to phase AB laterals, 562 of them are connected to phase BC laterals, and 252 of them are connected to phase CA laterals.

The example clustering and phase identification results are shown in Table I above. These example results may be interpreted as follows. The clustering and phase identification algorithms group the smart meters into three clusters. The phase identified for each cluster is listed in the identified phase column. If a meter is assigned to a cluster whose identified phase is the same as the meter's actual phase, then it is assigned to the correct cluster. The accuracy column shows the percentage of correct assignments in each cluster and the overall accuracy column shows the overall accuracy of the phase identification algorithm.

Table I shows that the phase identification algorithm of both unconstrained and constrained clustering achieved at least 90% overall accuracy in September and October. In addition, in all months, the constrained clustering algorithm yields a higher accuracy than the unconstrained k-means clustering algorithm. The constrained clustering outperforms the unconstrained clustering by letting must-link constraints pull a linked meter back to the correct cluster when it is near the boundary of two clusters.

Figure 3:
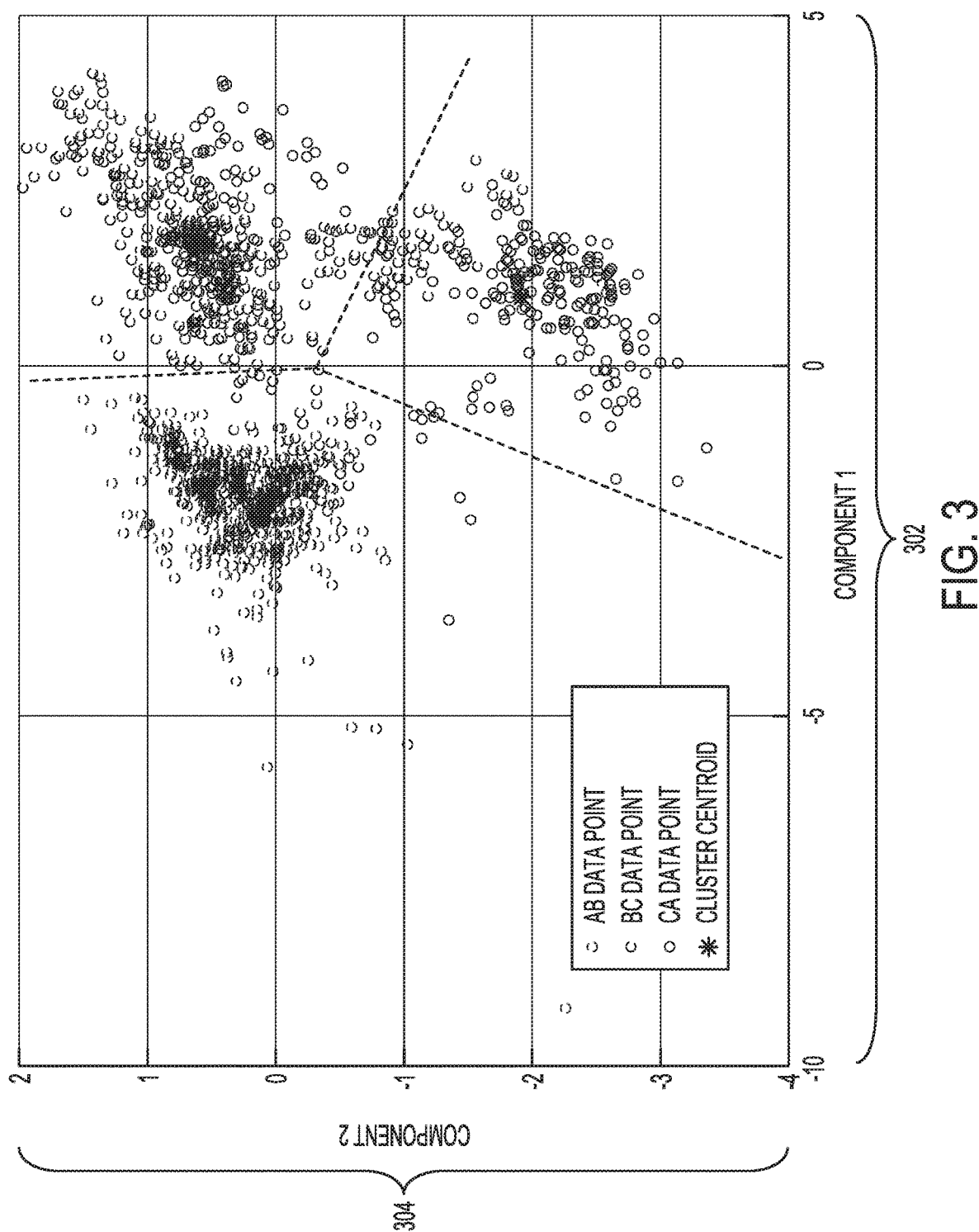
FIG. 3 illustrates an example distribution of voltage time series data, in accordance with some embodiments.
Figure 4:
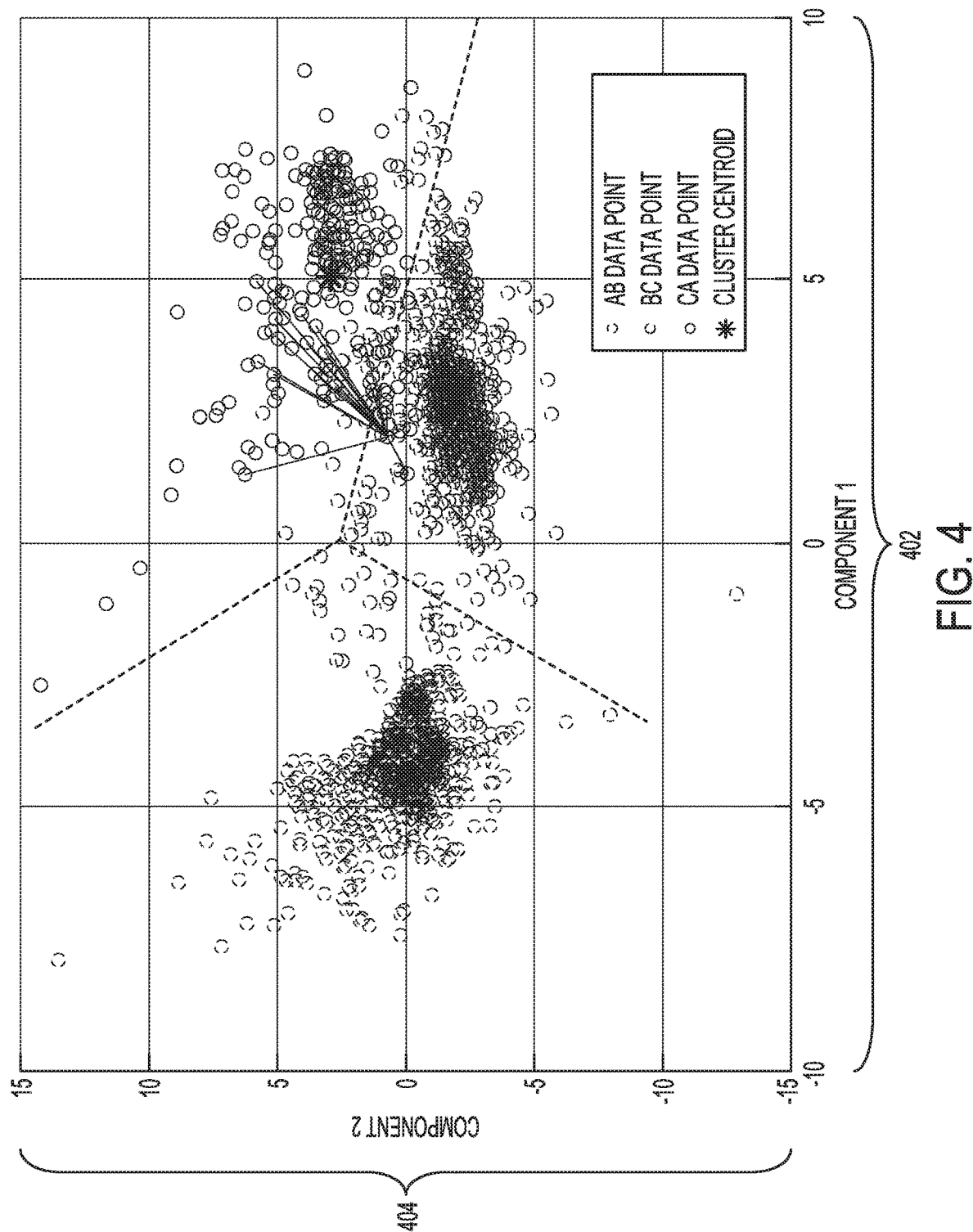
FIG. 4 illustrates another example distribution of voltage time series data, in accordance with some embodiments.

FIGS. 3 and 4 illustrate example distributions of voltage time series data, in accordance with some embodiments. In particular, FIGS. 3 and 4 show the distributions of two months of voltage data points in the space of the first two principal components. For example, FIG. 3 shows the distribution of August voltage time series data, with voltage data points in the space of the first two principal components, 302 and 304. Also, for example, FIG. 4 shows the distribution of October voltage time series data, with voltage data points in the space of the first two principal components, 402 and 404. In FIGS. 3 and 4, dashed lines are the boundaries of Voronoi cells associated with cluster centers derived from the constrained clustering algorithm.

FIG. 4 also shows an example of how the constrained clustering algorithm improves the accuracy of phase identification. For example, in FIG. 4, a set of CA cluster data points grouped by must-link constraints are connected by solid lines. Although this set of data points are separated by a boundary, they are closer to the CA cluster as a whole. Therefore, they are assigned to the CA cluster, which is the correct phase. Without these must-link constraints, some of the data points will be assigned to the BC cluster, which is incorrect. FIGS. 3 and 4 show that data points of different phases are separated in the space of the first two principal components. However, there are more data points of phases BC and CA overlapped in FIG. 3 than in FIG. 4. As a result, the overall accuracy of phase BC and CA are lower when using data from August, compared with data from October.

Figure 5:
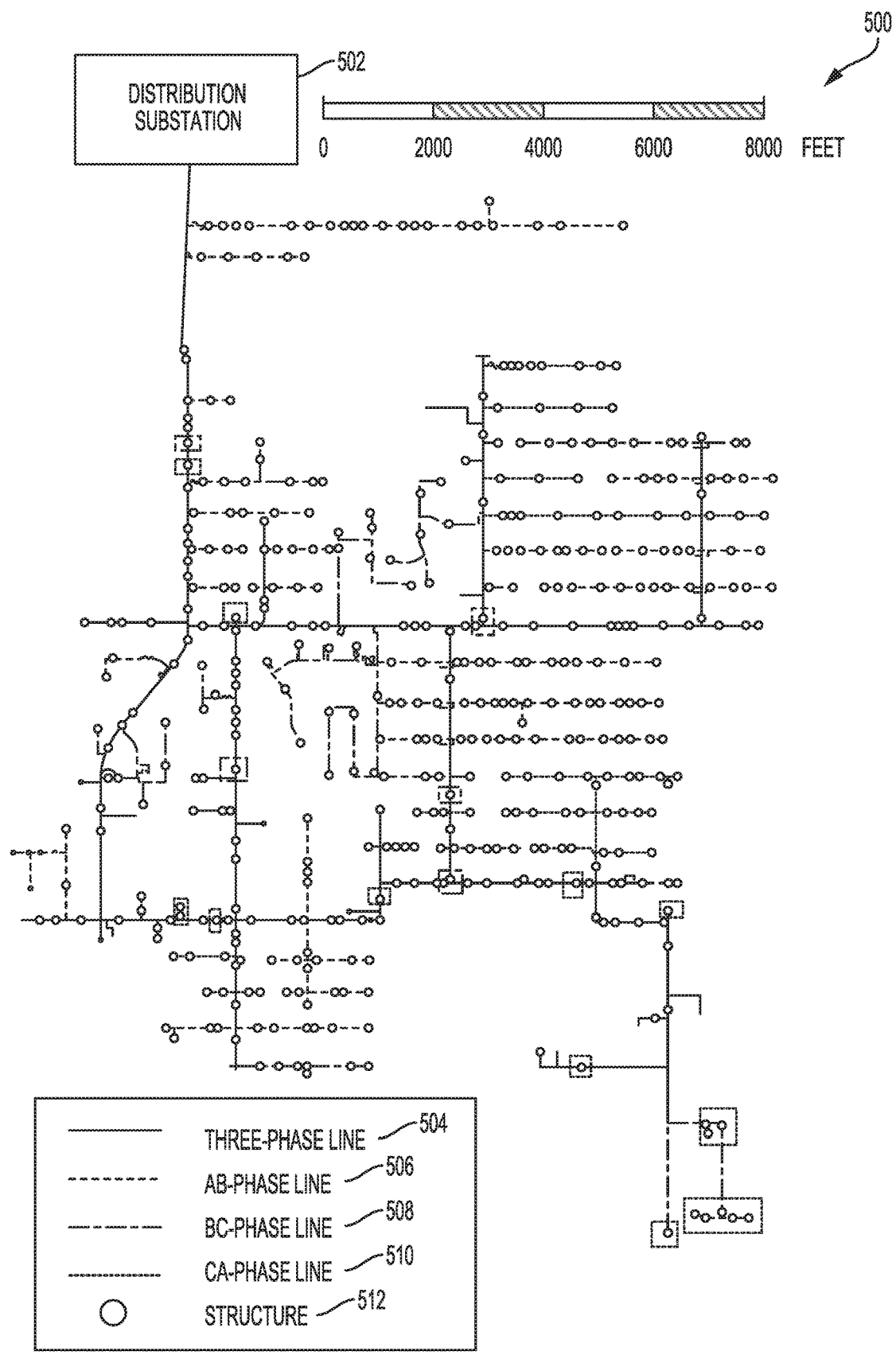
FIG. 5 illustrates example phase identification results, in accordance with some embodiments.

FIG. 5 illustrates example phase identification results 500, in accordance with some embodiments. In particular, FIG. 5 shows the clustering results on the distribution circuit map for a distribution substation 502 based on the smart meter data of October 2015. In FIG. 5, each line is colored according to its actual phase. In FIG. 5, each structure 512 (e.g., a transformer) is represented by a small dot. In FIG. 5, the solid three-phase black lines are primary feeder lines 504. Structures may be connected to primary feeder lines 504 through a three-wire single-phase (120/240V) system, so they may be connected to any phase of AB lines 506, BC lines 508, and CA lines 510. In FIG. 5, a rectangle is overlaid on top of a structure 512 if it is assigned to a wrong cluster. The type of line (e.g., solid, dashed, dotted) of a rectangle shows the identified phase of the cluster. Note that the number of structures 512 in results 500 is smaller than the number of smart meters/customers as a distribution transformer typically serves several customers.

The results 500 in FIG. 5 show that the constrained k-means clustering algorithm groups the meters by phase at high accuracy, and the identification method correctly identifies the phase of each cluster.

An innovative distribution system phase identification algorithm using constrained k-means clustering of smart meter data is presented in the present disclosure. The example algorithm leverages the network connectivity information to avoid mislabeling of customers on the same secondary feeder. Utilizing only the smart meter and SCADA information, the proposed algorithm is not only computationally efficient but also yields high accuracy; a real-world distribution feeder was used as a test case to validate the example algorithm. The case study results discussed above and provided in Table I and FIG. 5 show that the constrained k-means clustering algorithm outperforms the unconstrained algorithm. The overall accuracy of the example algorithm is at least 90%.

Table I shows that this example algorithm performs better during some months than during others. In some embodiments, algorithms not only perform phase identification but they also estimate the confidence level of clustering result for each individual meter.

Additional or alternative embodiments pertain to a probabilistic phase identification algorithm. In addition to identifying the phase connectivity of a structure/customer, the probabilistic phase identification algorithm also provides the confidence level of each customer's phase assignment. Beneficially, the probabilistic phase identification algorithm allows electric distribution system power engineers to spend more time performing field validation only for the few customers whose phase assignment have a low confidence level.

To estimate the probability that a customer is connected to a given phase, an embodiment uses a fuzzy rule-based phase identification approach. In the traditional k-means clustering method, the membership of a customer $x_k$ in the i-th cluster $u_{ik}$ can only take on a value of 0 or 1. In the fuzzy rule-based approach, the membership $u_{ik}$ can take on any positive value subject to the constraint that the memberships of a customer k across all c clusters sum to 1. The memberships assigned to each customer $x_k$ are inversely related to the relative distance of $x_k$ to the cluster centers $\{V_i\}_{i=1,\ldots,c}$ [57]. For example, if c=2 and $x_k$ is equidistant from two cluster centers, the membership of $x_k$ in each cluster will be the same (=0.5). The confidence level associated with the membership assignment can then be found through minimizing the weighted sum of square distances between the customers and the cluster centroids.

The objective function of the optimization problem may be formulated as $\text{Min} \Sigma_{i=1}^{c} \Sigma_{k=1}^{n} (u_{ik})^2 \|x_k - v_i\|^2$. The constraints are (1) $u_{ik} \in E [0,1] \forall i, k$ and (2) $\Sigma_{i=1}^{c} u_{ik} = 1$.

In other words, each $x_k$ could belong to more than one cluster with each belongingness taking a fractional value between 0 and 1. The problem may be solved iteratively by alternating optimization by leveraging the necessary conditions for its local minima. The alternating optimization approach iteratively estimates 1) the membership values $u_{ik}$ and 2) the updated cluster centers $v_i$.

An additional feature of the probabilistic phase identification algorithm is that it considers how effectively utilities use existing phase connectivity information to further improve the accuracy of the phase identification problem. If a small subset of customers' phase connectivity information is known, then the connectivity of the remaining customers may be extrapolated with high accuracy. The extrapolation may be done with any typical machine learning algorithms, but most rely on a large initial subset of customer data measurements. Since measurements have a high opportunity cost, the algorithm that seeks to minimize the size of this initial subset with accuracy is necessary.

To minimize the size of the subset, an example method is based on the Topological Data Analysis algorithm Mapper. Mapper is an algorithm that finds connectivity in data by applying a multidimensional filter function to it. The filter's codomain is then covered by an open covering. The open covering is converted to a simplicial complex called the nerve of the open covering, and this simplicial complex is pulled back through the filter to form a simplicial complex on the data. Data that is connected through this complex are closely related and may be clustered together.

Figure 6:
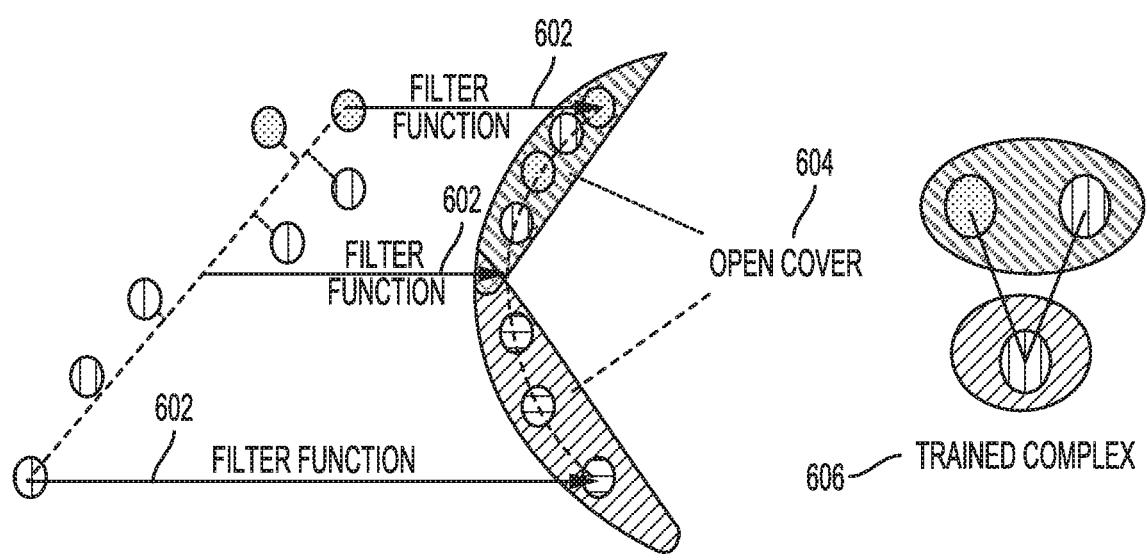
FIG. 6 illustrates an example formation of a base simplicial complex, in accordance with some embodiments.

In an embodiment, the Mapper algorithm is expanded into a classification algorithm by first performing Mapper on the training data and saving the resulting simplicial complex (see FIG. 6). FIG. 6 illustrates an example formation of a base simplicial complex, in accordance with some embodiments. In particular, FIG. 6 shows how a filter function 602 is applied to open cover 604 (i.e., open covering) to form a trained complex 606.

Each node in the complex is then assigned a phase label by a majority rule on the customers in that node. This simplex can then be used to assign labels to new data. Any new data will be sent through Mapper. This will send the new data point to a node, but will not change the original complex. The node that the data point is sent to will then be compared with the nodes of the original complex, and the closest node's label will be assigned to the new data point. To make this algorithm work, three choices are made. First, a distance metric is chosen. Next, in the example of FIG. 6, a filter function 602, and finally, an open covering 604 of the codomain of the filter is applied. The open covering 604 is easy to characterize and therefore easy to choose. Larger open coverings 604 lead to more resolution (less customers per node). The filter function 602 and distance metrics are more difficult.

One benefit of the proposed method is its visualization properties. Once all phase labels are chosen for the training data, embodiments may map these labels to integers (in any way) to form a new filter. Appending this filter to the old one and running Mapper on the training data will then yield three copies of the original complex-one for each phase. Nodes that are more uniformly spread across these phases may be considered less reliable than nodes that are concentrated on one phase.

Distribution Network Phase Identification Through Topological Data Analysis

According to additional or alternative embodiments, phase identification is accomplished through topological data analysis. These embodiments are described in the following sections.

Phase connectivities of structures fed by a distribution network (e.g., an electrical distribution network such as the example provided in FIG. 1) are important to the modeling, operation, and optimization of that network. However, phase connectivities are often mislabeled or missing entirely. As discussed above, phase connectivity may be measured, but such measurements are expensive. In accordance with embodiments, a minimally supervised machine learning algorithm accurately generalizes a small number (i.e., a subset) of phase connectivity measurements to the entire distribution network. According to such embodiments, the algorithm itself is an extension of the Mapper algorithm in topological data analysis. In examples discussed herein, real distribution feeder data provided by a power utility (e.g., an electrical utility), is used to show that this example algorithm can correctly generalize the phase connectivity of over 96% of the buildings/customers in a distribution feeder by measuring just 5% of them. Embodiments pertain to electric distribution networks, machine learning, phase identification, smart meter data, and topological data analysis. In the topological data analysis embodiments, algorithms, and formulae discussed in the following paragraphs, the nomenclature below is used.

NOMENCLATURE

X The data set.
$d_X$ A distance metric.
Y A low-dimensional topological space.
$f$ A filter function.
U An open set of Y.
α An index for an open covering on Y.
J The index set for an open covering of Y.
V An open set of X.
β An index for an open covering on X
K The index set for an open covering of X.
C An open covering.
N The nerve of an open covering.
$x_t$ A training data point.
$x_T$ A selected test data point.
$v_f$ A forest vector.
μ An ensemble mean.
std An ensemble standard deviation.
Σ A simplicial complex.
σ A simplex in a simplicial complex.
τ A topology.
$B_\in(r)$ An open ball of radius ∈ centered at r.

Distribution system operators (DSOs) rely on various optimization and planning tools to efficiently operate a distribution network. These tools require an accurate model of the network itself. A significant part of a distribution network model is the subset of phases connected to each building. These phase connections are not documented accurately in real distribution circuits; they are often mislabeled or rearranged during network maintenance and expansions. Thus, an accurate method of identifying the phases connected to each building in a distribution network is important to that network's operation. When phases are not identified correctly, all optimization and planning algorithms used on a distribution network are run on the wrong circuit and will yield results that are inaccurate to the true circuit.

With the large-scale deployment of smart meters, machine learning algorithms and advanced data analytics have become viable solution techniques to several problems at the distribution network level. By extending and synergistically combining advanced techniques in data analytics and machine learning, the present disclosure introduces a novel algorithm that solves the phase identification problem with high accuracy and low supervision.

On the data analytics side, topological data analysis (TDA) represents a suite of computational methods used to infer the structure of an unknown topological space (e.g., some high-dimensional manifold) from which input data is measured. The central method to TDA is persistent homology, but one particular algorithm, called Mapper, generates an easily visualized approximation of this hidden structure so that the user can quickly make important inferences from the dataset.

Some embodiments extend Mapper to a machine learning algorithm capable of accurately identifying the phases connected to every building in a distribution network. Further, certain embodiments do this by using only a small set of samples as training data. By applying this extension to a real distribution network in Southern California, the phase connectivities of 96% of the constituent buildings were accurately identified when only 5% of the buildings were used as training data.

The rest of the present disclosure is organized as follows. First, a review of past attempts of phase identification and discussions of advantages and disadvantages of each existing technique are provided. Then, detailed descriptions of the Mapper algorithm and its extension to a supervised machine learning algorithm are provided. This is followed by a discussion of the results of the extension when applied to the phase identification problem on a case study. Lastly, the mathematics behind the Mapper algorithm are provided.

TDA Background and Review

Understanding the phase identification problem begins with understanding the network topology of a radial distribution network. A distribution network starts with a substation and typically descends in a tree-like structure to laterals and then to customers. The substation transformer is used to step down the high voltage of the transmission network. Both sides of the substation use three-phase wiring. From the secondary side of the transformer, any combination of phase wires may be tapped and sent into laterals, which are then stepped down once more before connecting to customers. The combination of phase wires used for a given lateral depends on the customers that the lateral feeds. Large commercial buildings will often connect to all three phases, while residential houses will often use a single phase (e.g., A, B, or C for line-to-neutral loads or AB, BC, or CA for line-to-line loads) to form a split phase center-tapped connection. Determining which combination of phase wires compose the lateral that feeds a given structure is the phase identification problem.

A phase identification system has been developed based on high-resolution timing measurements communicated between the base station and the feeder transformer secondaries. This system is highly accurate and even yields the voltage phasors of the secondaries themselves instead of just the phase names of the wires connected to them. However, the system is quite sophisticated, and deploying such a system for each feeder in a distribution circuit (or more realistically, across several distribution circuits) is challenging and expensive.

An existing method seeks to perform phase identification through signal injection. A signal generator is placed at the base substation and a unique signal is created for each phase. These signals are detected by a signal discriminator at each customer location. By matching the signals, the phase connectivities may be accurately reproduced. However, this method requires many devices to be installed into the network.

Another existing phase identification technique seeks to use microsynchrophasors. For example, in a phase identification system, microsynchrophasors measure voltage phasors directly. This method has a few advantages, however. First, microsynchrophasors are much simpler to use than the system of high-resolution timing measurements and communications required by the previous method. Secondly, microsynchrophasors are mobile. This means that only a few devices (and a database) are needed to obtain the phase connectivities of an entire distribution network. However, this still requires significant manual labor as each secondary must be physically measured at least once.

Another existing technique seeks to use a load flow estimation algorithm coupled with substation measurements and customer load data to predict phase connectivity. By choosing (arbitrarily at first) the phase connectivities of the circuit, a model of the network is formed. Load flow is run on this model and the output is compared to the measurements. The goal, then, is to iteratively change the phase connectivities such that the error between output and measurements is minimized. Phases are changed in iteration based on a set of allowed 'moves'. By implementing Tabu restrictions, the space of allowed moves is significantly reduced such that the algorithm's computational complexity is limited. However, the method achieved only 50% accuracy. This percentage was significantly improved to 78.5% by including nodal measurements of the network, but the results are highly sensitive to the number and locations of these measurements.

Yet another existing technique seeks to identify phase connectivity by assuming a configuration, calculating the power consumed by each phase, and then changing the configuration until the consumption matches the substation powers delivered to the network. While the method performs extremely well, its scope is limited as any missing data will cause a power mismatch between the secondaries and the measured loads. Furthermore, it assumes that each customer is connected to a single phase only and thus does not perform well on circuits involving line-to-line connections.

An additional existing technique attempts to identify phase using only voltage measurements at the customer and lateral levels of the network. By computing the correlations between the voltages at these levels, good results were obtained. However, voltage measurements at the lateral level requires extra infrastructure.

Another existing technique also attempts to identify phases through just voltage magnitude data gathered by smart meters. In this case, however, the voltage magnitude data is compared to the base substation rather than the voltage at the laterals. Thus, no additional equipment is needed beyond the smart metering infrastructure. A linear regression model is assumed to represent the measured voltage levels as a linear function of substation power on an assumed phase, substation voltage on that phase, and the power consumed by the customer. The model is then fit from meter data three times (one for each phase assumption) and the fit with the highest $R^2$ value is taken. The accuracy of this existing technique was uncertain due to model uncertainties and it is not fit for substations in delta connection or for customers that have line-to-line connections, but it is easily implemented and may be used to solve several other problems in distribution networks as described in the present disclosure.

In the present disclosure, a method of phase identification is described which uses voltage metering data. Beneficial features of embodiments presented herein include:
  Methods that yield high accuracy with little infrastructure and physical labor.
  The methods do not require any modeling of the network. For example, branch impedances do not need to be known.
  The methods are robust with respect to missing data.
  Implementations and tuning of the example algorithms are very user-friendly.

The methods can handle any type of phase connectivity without additional changes.

According to some embodiments, phase identification methods use measurements of the connectivity of some structures (e.g., with microsynchrophasors), but the amount of measurements is extremely low. Such example methods improve phase identification accuracy without requiring measuring every structure. Thus, such example methods serve as a good tradeoff between accuracy and labor. The methods themselves perform much better than traditional machine learning algorithms, especially at low levels of training data, and can thus be used in other machine learning problems as well.

Example TDA Methods

This section uses several topological notions. Formal definitions of abstract simplicial complexes, topologies, the discrete topology, the Euclidean topology, the weak topology, open coverings, and the nerve of an open covering are all provided later in the present disclosure.

The method of phase identification used in some embodiments is an extension of the Mapper algorithm in TDA. Mapper transforms an input metric space into an easily visualized representation called an abstract simplicial complex. From this simplicial complex, subsets of similar data points are easily identified. In this sense, Mapper is akin to a human-aided clustering algorithm. Some embodiments extend Mapper to a human-aided classification algorithm. According to such embodiments, this extension is performed by learning the algorithm's two most critical parameters from training data, building a base simplicial complex from that training data, and defining how new data is classified from this base simplicial complex.

Figure 7:
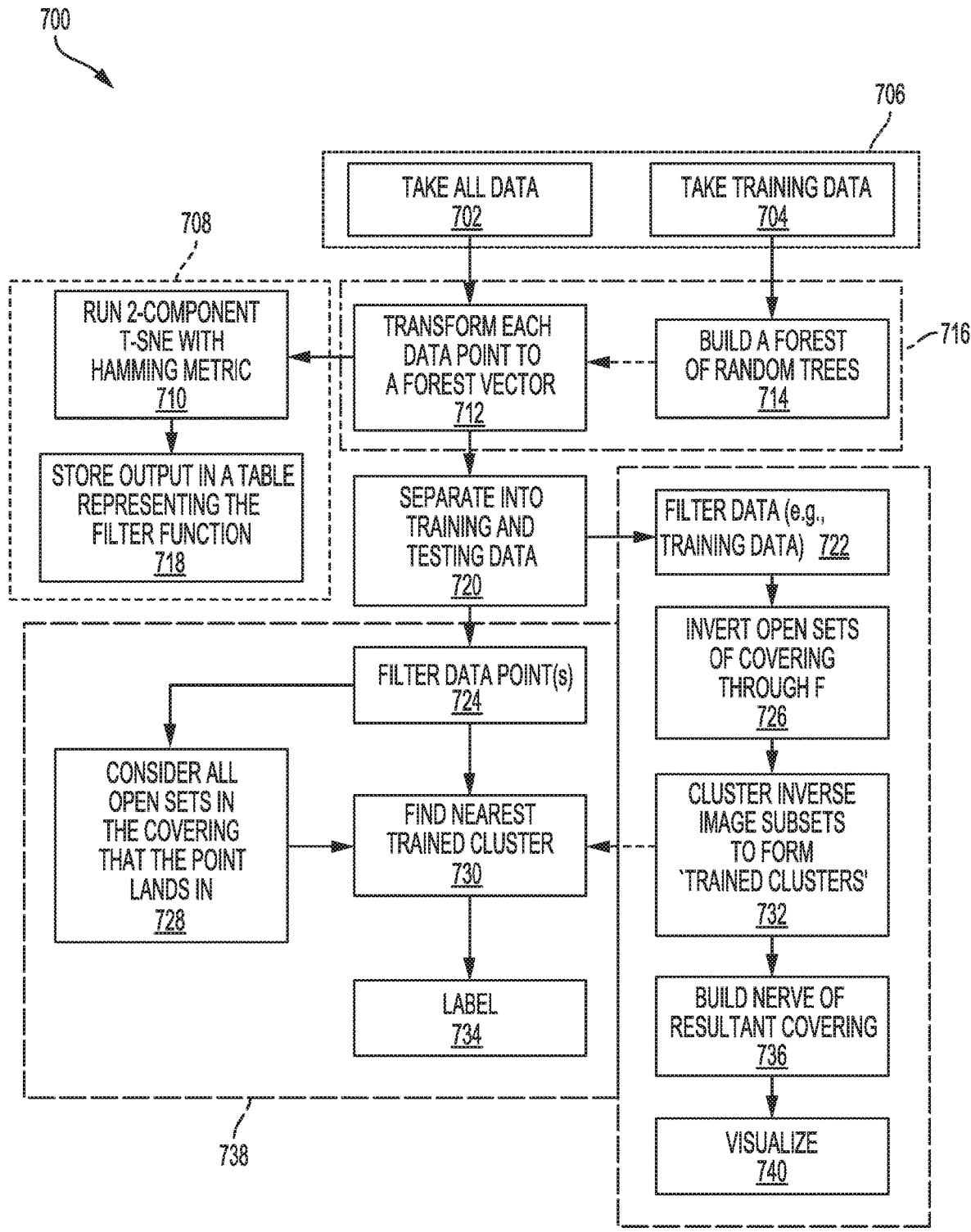
FIG. 7 illustrates the operation of a method of phase identification which uses voltage metering data, in accordance with some embodiments.

FIG. 7 illustrates the operation of a method 700 of phase identification which uses voltage metering data, in accordance with some embodiments. The example method 700 is summarized in FIG. 7. At block 706, operations 702 and 704 are performed to initialize the algorithm. As shown, operation 702 obtains all data (e.g., voltage measurements including a plurality of customer voltage time series) and operation 704 obtains training data.

Then, at block 716, operation 714 uses the training data obtained at operation 704 to build a forest of random trees. At operation 712, this forest is used to transform each data point into a forest vector.

Next, in block 708, at operation 710, a two-component t-SNE algorithm is run on the entire ensemble. As shown in FIG. 7, operation 710 may comprise running the t-SNE algorithm with a hamming metric. At operation 718, the numerical results are stored (for each data point) in a table which represents the filter function.

At operation 720, the ensemble is then split into training and testing data. The training data is then put through Mapper by performing operations 722, 726, 732, 736, and 740 to build a base simplicial complex. As shown, operation 722 filters the training data, operation 726 inverts open sets of a covering, operation 732 clusters inverse image subsets to form trained clusters. With continued reference to FIG. 7, operation 736 builds a nerve of the covering, and operation 740 provides a visualization (e.g., presents a visualization on a user interface of a display device).

Finally, in block 738, new data is classified by filtering that point at operation 724, performing operation 728 to consider open sets in the covering that the point lands in, and grouping it to the nearest appropriate cluster at operation 730. Lastly, the nearest trained cluster is labeled at operation 734.

Detailed Description of the Mapper Algorithm

An example Mapper algorithm takes as input a finite metric space $(X, d_X)$. X is the set of data points and $d_X$: $X \times X \to R$ is any distance metric. $d_X$ induces the discrete topology on X because X is finite, so every subset of X is considered open. In the first step of the algorithm, X is mapped to a low-dimensional topological space Y through a continuous filter function $f: X \to Y$. The codomain of $f$ is typically taken to be either Euclidean space $R^N$ with the Euclidean topology or some subset of $R^N$ (e.g., the unit circle $S^1$) with the weak topology.

Y is further equipment with an open covering $\{U_\alpha\}_{\alpha \in J}$. This may be pulled back through the inverse of $f$ to form an open covering of X, $\{V_\beta\}_{\beta \in K}$ as follows. For each open set $U_\alpha$ in the covering of Y, the inverse image $f^{-1}(U_\alpha)$ is found. This image, which is a subset of the data set X, is then clustered according to any predetermined clustering algorithm (single linkage hierarchical clustering was used here). The clustering is performed without the influence of the other data points in X. Each cluster output by this procedure will be a subset of data points which will then be placed in the open cover of X. The steps that cluster inverse images may be referred to herein as back-clustering steps. For brevity, the present disclosure also denotes the open cover on Y as $C_Y$ and the constructed covering on X as $C_X$.

Open covers are readily converted to simplicial complexes called the nerve of the covering. Thus, a simplicial complex representing X is found by performing the above steps to get an open covering on X and then converting this open covering to its nerve. The nerve of $C_Y$ is labeled $N(C_Y)$ and the nerve of $C_X$ (the output of Mapper) is labeled $N(C_X)$.

To obtain insights about what the output simplicial complex tells us, consider two of its 0-simplices $\sigma_1$ and $\sigma_2$. If these two simplices were generated in the same back-clustering step, then they will not be connected. Otherwise if these two simplices were not generated in the same back-clustering step, then $\sigma_1$ is a cluster in the inverse image of some open set $U_1$ and $\sigma_2$ is a cluster in the inverse image of some open set $U_2$ with $U_1 \neq U_2$. Then $\sigma_1 \cup \sigma_2$ forms a 1-simplex in the output if and only if $\exists x \in X$ such that $f(x) \in U_1 \cap U_2$. Thus, the Mapper output, in a sense, represents the filtered connectivity of the data.

Figure 8:
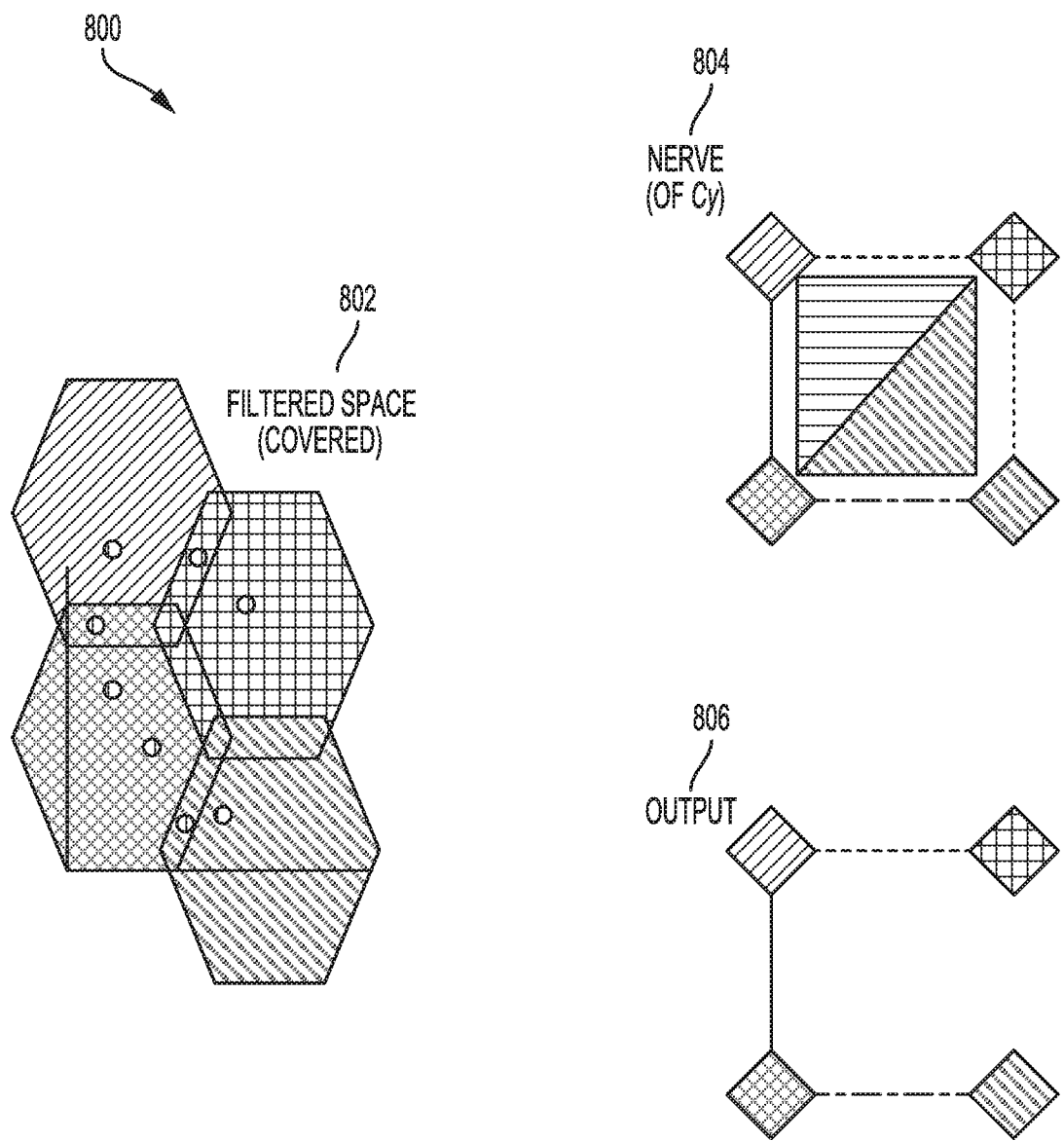
FIG. 8 depicts constructions and output of a Mapper algorithm, in accordance with some embodiments.

FIG. 8 depicts constructions 800, including output 806, of a Mapper algorithm, in accordance with some embodiments. As illustrated in FIG. 8, the Mapper output 806 may represent the filtered connectivity of the data. FIG. 8 contains three objects. The object on the left, covered filtered space, represents $Y=R^2$ covered by open hexagons (e.g., a hexagonal covering 802). In FIG. 8, the dots represent the image of data points under a filter $f: X \to R^2$. The object on the top right of FIG. 8 represents a nerve 804 of the hexagonal covering 802. The nerve 804 has constituents that should be read as follows: diamonds represent 0-simplices, edges represent 1-simplices, and filled triangles represent 2-simplices. There is a 0-simplex for every hexagon, a 1-simplex for every intersection of two hexagons, and a 2-simplex for every intersection of three hexagons. The object on the bottom right represents Mapper's output 806. The constituents of the output 806 should be read the same way as those of the nerve 804. The output 806 is different from the original nerve in that several simplices have been removed. A simplex is removed if the corresponding intersection does not contain a data point mapped through $f$. It is clear that the Mapper output 806 somewhat captures the connectivity of the data in the filtered space.

In some embodiments, a Python Mapper implementation of this algorithm is used. For example, a Mapper implementation with 30 unit squares may be used for the open covering of the filtered space.

Extending to a Classification Algorithm

Suppose the data set X is partitioned by training data and test data. The training data are those data points for which the phase labels are known, and the test data are those data points for which the phase labels are not known. It is desired to obtain accurate labels for the test data given only the training data. This cannot be achieved with Mapper alone. Mapper can form a simplicial complex that visualizes connections between similar data points, but a rule must be set for labeling the test data points from the complex. Furthermore, certain embodiments need the complex itself to represent connections related to the phase labels if certain embodiments are to achieve high accuracy. To ensure such connections are represented, it is reasonable to build the simplicial complex from only the data in which the labels are known.

The extension used in some embodiments is described as follows. First, certain embodiments build the simplicial complex from the training data alone. To ensure that this complex represents the connections that are desirable, certain embodiments train the distance metric and filter function of Mapper with the training data. This is the subject of the next two subsections. Once the complex is built from the training data, the 0-simplices are labeled by majority rule. That is, certain embodiments look at the data points in each open set $U \in C_X$ and label the corresponding 0-simplex by whichever phase label occurred most frequently. Finally, each test data point $x_t$ is labeled as follows. $x_t$ is first sent through the filter function $f \cdot f(x_t)$ will fall into one or more of the open sets in $C_Y$. These open sets will also contain the image of some of the training data (if they do not, then the label of $x_t$ is chosen through the simple nearest neighbor algorithm). This subset of training data is then separated from the rest of X, and the nearest training data point to $x_t$ in this subset is selected with nearness measured in the original space.

This selected training data point is referred to herein as $x_T$. This selected data point will belong to one or more of the open sets of $C_X$ which have corresponding 0-simplices in $N(C_X)$. If $x_T$ belongs to only one such set, the label of this 0-simplex is given to $x_t$. If $x_T$ belongs to multiple subsets in $C_X$ (i.e., $f(x_T)$ lies in the intersection of open covers in $C_Y$), then the most confident of these open sets is selected. A description of an embodiment for estimating the confidence of the open sets is provided below with reference to FIG. 9.

Figure 9:
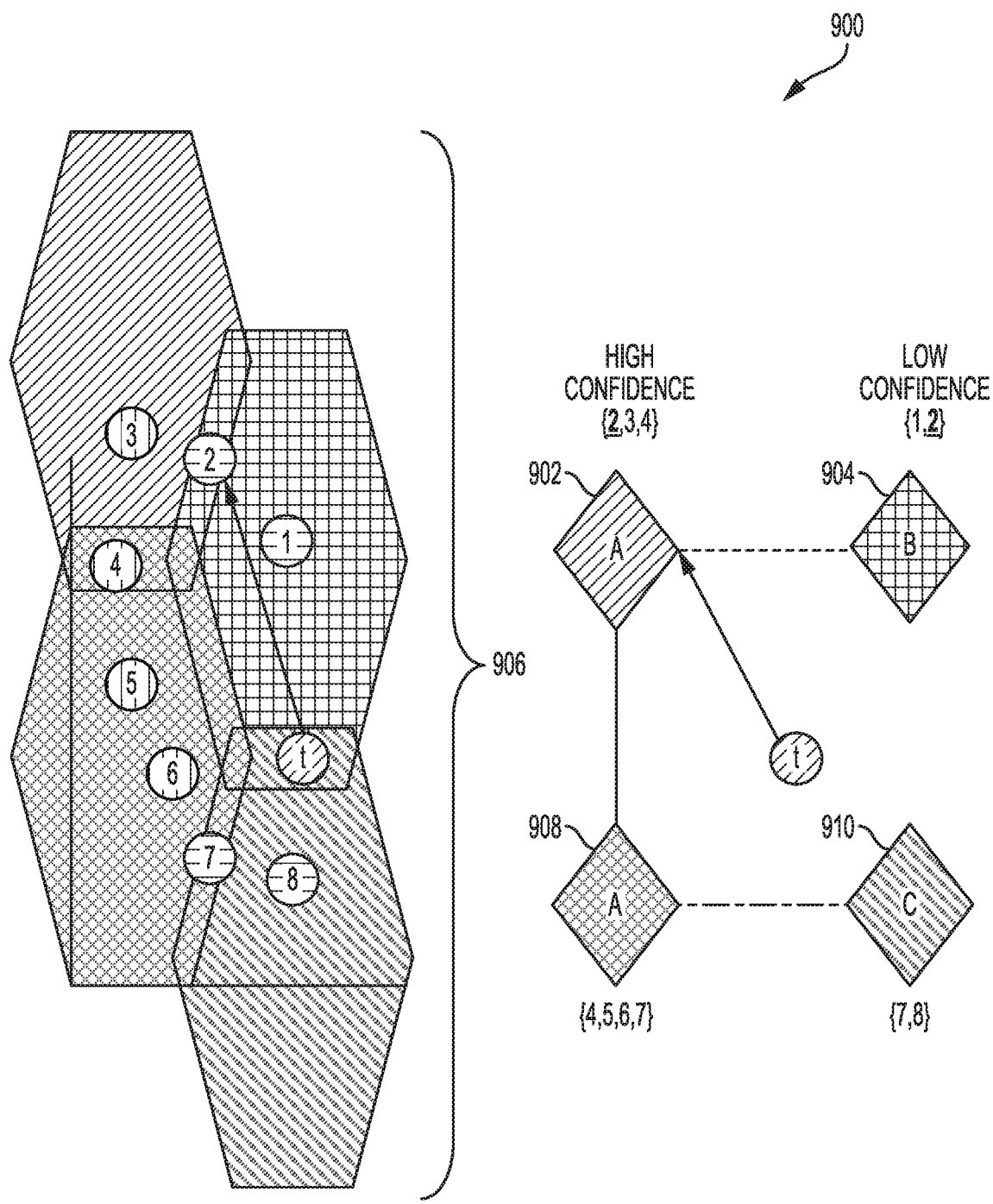
FIG. 9 illustrates a visualization of extending a Mapper algorithm to a classification algorithm, in accordance with some embodiments.

FIG. 9 illustrates a visualization 900 of extending a Mapper algorithm to a classification algorithm, in accordance with some embodiments. In particular, the visualization 900 is shown in FIG. 9, where the possible phase labels are assumed to be A-902/908, B-904, and C-910. The dot t represents the test data point $x_t$. There are four training data points selected from the location of $f(x_t)$. These have been labeled 1, 2, 7, and 8 in FIG. 9 (included in training data points 906). The closest of these points, in the filtered space Y, is the one to the bottom left of $f(x_t)$. However, this is not necessarily the closest point to xt in (X, $d_X$). In the example of FIG. 9, the point above and the left of $f(x_t)$ is the closest, and so it is selected. It belongs to the top right and top left 0-simplices of $N(C_X)$ as shown in the right object of the figure. In this example, the top left simplex is more confident than the top right one. Since this 0-Simplex is labeled A-902, $x_t$ will also be labeled A-902.

Confidence Estimation

Some open sets of $C_X$ (and the corresponding 0-simplices of $N(C_X)$) will be more reliable than others. With the Mapper setup, it is easy to estimate the confidence of each open set both numerically and visually.

Numerically estimating the confidence of an open set $V \in C_X$ is straightforward. Each training data point $x \in V$ is already labeled. Then, if V has phase label P, it is sufficient to find the percentage of data points in V that have phase label P.

This confidence can also be encoded visually in the trained simplicial complex. First, each open set of $C_X$ is split into three new open sets by phase label. This forms a new open covering $\overline{C}_X$. The nerve of $\overline{C}_X$, $\mathcal{N}(\overline{C}_X)$ is then further extended to include all 1-simplices consisting of the 0-simplices in $\overline{C}_X$ whose corresponding open sets in $\overline{C}_X$ were generated at the same open set in $C_X$. This extended nerve is referred to as: $\mathcal{N}(\overline{C}_X)$.

This example procedure generates three copies of the original trained simplicial complex—one for each phase (see, e.g., FIG. 10, discussed below). If the 0-simplices of this new complex are sized (in the visualization of the complex) by number of data points in the corresponding open set of $\overline{C}_X$, then it is easy to quickly visualize the performance of each node. This can help substantially in modifying any parameters of the algorithm on the fly to achieve better results.

Figure 10:
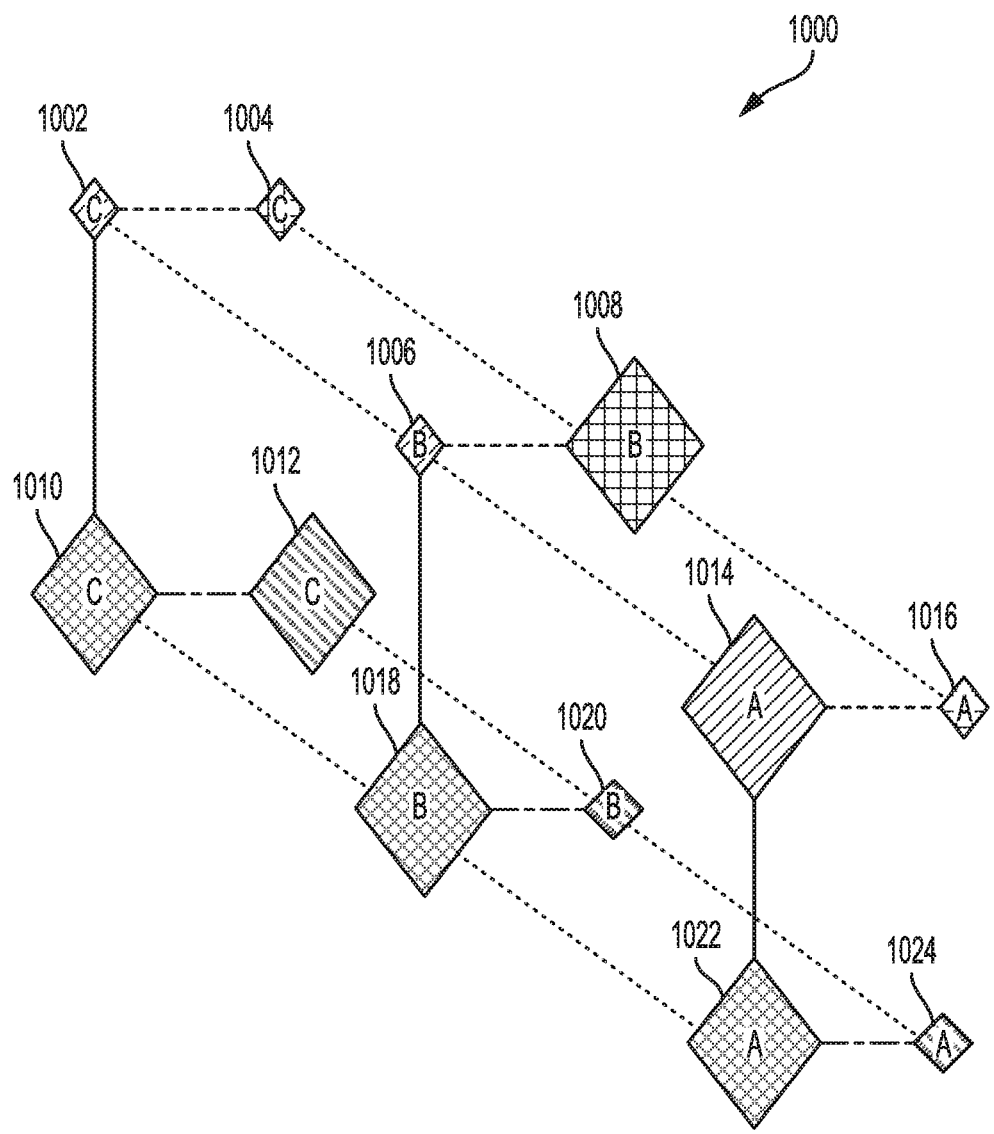
FIG. 10 illustrates splitting a simplicial complex by phase, in accordance with some embodiments.

FIG. 10 illustrates splitting a simplicial complex by phase, in accordance with some embodiments. In particular, an example 1000 of an extended simplicial complex is shown in FIG. 10. In the example 1000 of FIG. 10, each layer is one copy of the original simplicial complex. In FIG. 10, the layers are connected via dotted lines representing the added 1-simplices. Most of the 0-simplices carry high confidence. For example, the data points in the open cover $C_X$ corresponding to the 0-simplex on the top right (C-1004, B-1008, and A-1016) is contained mostly in the B layer; few of the data points are contained in the layers of the other two phases. Thus, if a test data point accepts the label from this node, we may be confident that that test data point should indeed have label B. However, the bottom left (C-1010, B-1018, and A-1022) 0-simplex has its data points spread evenly across the three layers, so we should not be confident of the labels assigned to any test data points by this 0-simplex. If possible, this node should be focused on whether parameters such as the filter function are to be changed. As shown, the other data points in the example 1000 are spread across the three layers, C-1002, B-1006, A-1014, C-1012, B-1020, and A-1024.

Learning the Distance Metric

For good accuracy, certain embodiments use a distance metric that considers data points of the same label close and data points of differing labels distant. To achieve this, certain embodiments learn the distance metric itself from the training data.

To learn the distance metric, a hamming metric is formed from a forest of random trees. A forest of random trees is a set of decision trees created from the training data alone. The number of trees in the forest is determined ahead of time and each tree is built as follows. First, a random subset of the training data is selected. The depth of the tree is set to 0 and a random feature (e.g., hour 271) is selected. Next, the value of that feature that best separates the selected subset of training data by label is found (measured by entropy). The depth of the tree is then set to 1, and two features may be selected randomly (one for each branch). This will repeat until a pre-specified depth is reached or until the change in entropy from introducing a new depth becomes smaller than a set threshold. Once each tree is built, we will have a forest that is learned from the training data. In some embodiments, the forest may be created with the Python Sklearn class RandomForestClassifier. Once the forest is generated, the trees that it contains may be ordered arbitrarily.

In certain embodiments, the forest may be used to create a vector, which is referred to herein as a "forest vector", from each data point as follows. First, the data point is sent through each tree in order. At step i, the $i^{th}$ tree will ask a series of questions about the data point and send it to a leaf j. The value of the ith component of that data point's forest vector is then set to j. In general, each forest vector will have dimension equal to the number of trees in the forest, and each component will have a value from the set $\{0, 1, \ldots, 2^D-1\}$ where D is the depth of each tree.

The forest vectors are then used to determine the distance between any two data points via the Hamming Metric. If two data points $x_1$ and $x_2$ have forest vectors $v_{f1}$ and $v_{f2}$, then $d_X(x_1, x_2)$ is the number of components that differ between $v_{f1}$ and $v_{f2}$.

Figure 11:
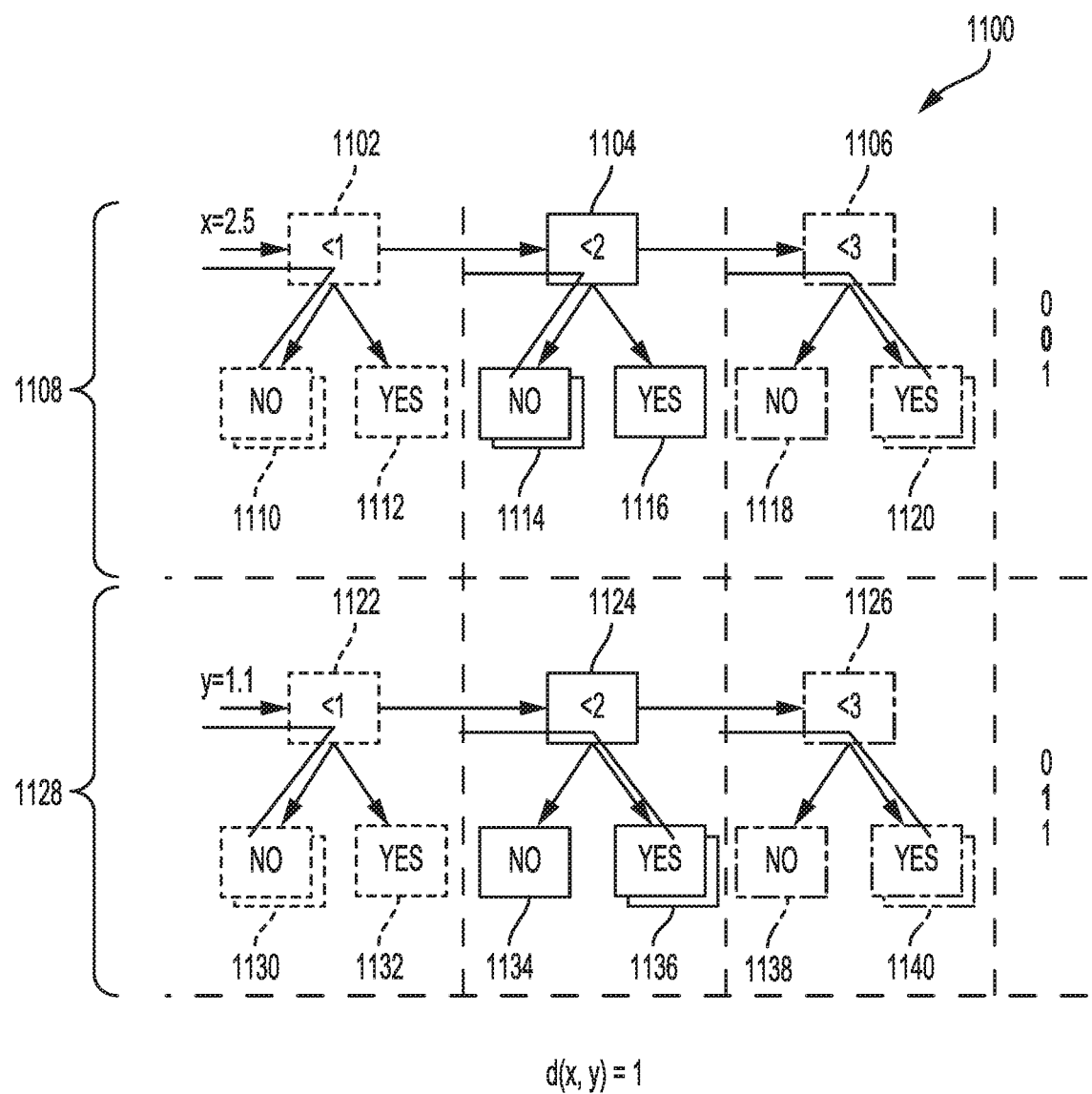
FIG. 11 illustrates a visualization of a distance metric, in accordance with some embodiments.

This metric is illustrated in FIG. 11. FIG. 11 illustrates a visualization 1100 of a distance metric, in accordance with some embodiments. As shown in FIG. 11, two one-dimensional data points x=2:5 (1108) and y=1:1 (1128) are compared. The data points 1108 and 1128 are sent through three trees of depth two. The trees ask, in order of appearance, whether or not the data point is less than one (see, e.g., 1102, 1122), less than two (see, e.g., 1104, 1124), and less than three (see, e.g., 1106, 1126). The respective answers to these questions for x=2.5 (data point 1108) are no (see, e.g., 1110), no (see, e.g., 1114), and yes (see, e.g., 1112), so x's forest vector is $[0,0,1]^T$.

The forest vector for y=1.1 (data point 1128) is $[0,1,1]^T$. These forest vectors differ only in the second component, so the distance between x and y, $d_X(x, y)$ is 1. The respective answers to these questions for y=1.1 (data point 1128) are no (see, e.g., 1130), no (see, e.g., 1134), and yes (see, e.g., 1132). In an example, results used 150 trees of varying depth.

Learning the Filter Function

To ensure that the trained simplicial complex of the Mapper algorithm separates the training data of different phase labels, the filter function $f$ is also learned. The filter function may be any standard classification algorithm with a numerical output. For example, one of the most popular classification algorithms is the support vector machine. Here, a support vector machine may be built to find the directions in which the data points are most sufficiently separated by phase label, and the inner product of the data points with the normal vectors to the found hyperplanes may be used as a multidimensional filter function. However, in certain cases, support vector machines are less accurate than using the two components of the two-dimensional t-Distributed Stochastic Neighbor Embedding (t-SNE) dimensionality reduction algorithm even when kernel tricks were used on the support vector machines. Thus, the t-SNE algorithm approach was used for our results.

Example results use the Python Sklearn implementation of the t-SNE algorithm. The t-SNE algorithm maps high-dimensional data sets such that data points that are close in the original space remain close and points that were distant in the original space remain distance. While the algorithm traditionally uses Euclidean distance, implementations for the Hamming metric are available.

Example Parameters of the Open Covering

While the open covering of the filtered space Y may be any open covering, it is useful in computation to use open sets from a parameterized set of a given shape. For example, FIGS. 8 and 9 use open hexagons of a given size to cover Y. The overlap between any pair of hexagons is also set. These parameters, (shape, size, and overlap) will characterize the results of the Mapper extension to some degree (though much less so than the distance metric and filter function).

First, the size of the open sets in the covering will determine the resolution of the trained simplicial complex. If the sets are small (in Lebesgue measure), then there will be more open sets in $C_X$ (as each nonempty open set in $C_Y$ generates at least one open set in $C_X$). Further, each of the open sets in $C_X$ will contain fewer points than if larger open sets were used. In the extreme case of small open sets in $C_Y$, there will be one open set in $C_X$ for each data point and thus the number of 0-simplices in the trained simplicial complex will be equal to the cardinality of X. However, in the other extreme, if there is only one large open set in $C_Y$ (Y itself) then there will be only one open set in $C_X$ (X itself), and thus only one 0-simplex in the trained simplicial complex.

Second, the amount of overlap between any two pairs of sets in $C_Y$ will determine the connectivity of the trained simplicial complex. This connectivity is determined by the 1-simplices included. 1-simplices are found whenever two open sets in $C_X$ have nontrivial intersection, but this happens only if the image of a data point under the filter function falls in one of the overlapping regions between two sets in $C_Y$. When these overlaps are larger, there is a higher chance that this happens.

Finally, the shape itself will influence the order of the simplices in the trained simplicial complex. Higher-order simplices are found when there are several open sets in $C_X$ with nontrivial intersection. For example, if three open sets in $C_X$ share data points, then three 1-simplices (one for each pair) and a 2-simplex will be generated in the trained simplicial complex. This happens only if multiple sets in $C_Y$ overlap. For example, in FIG. 8, the largest intersection of open covers involves three open sets in $C_Y$ so there will never be a 3-simplex in the trained simplicial complex (but a 2-simplex is possible). If a less efficient shape were used, such as squares, then higher-order simplices would be possible.

Example TDA Results—Data Description and Preparation

The data used to test the example phase identification algorithm is from a power utility (e.g., an electrical utility). The data consists of hourly averaged voltage magnitude data for all buildings and structures in a particular distribution network during the month of October. In this example, only voltage magnitudes are measured; if voltage phasors were measured, then the problem of phase identification would be trivial. This distribution network was measured in full to obtain the phase connectivity data of each building and structure, and the correct phase labels were provided. The data consists of 1274 data vectors that each have 744 features. Each feature is a voltage magnitude at the respective hour.

Some of the data points had missing measurements and thus had dimension less than 744. Data points of this type (30 in total) were discarded. Furthermore, buildings connected to all three phases at once are easily identified by checking if the voltage magnitude of that building is close to 208V or 480V, and so all data points of this type (six in total) were also discarded. Thus, there remained 1228 data points of dimension 744 which were each connected to two phases. The voltage levels of these remaining customers were all 240V with small variations. The possible labels are AB, BC, and CA.

The data was standardized before running the algorithm. That is, each component of the ith data point was transformed through the following example equation:

$$x_{ij} \to \frac{x_{ij} - \mu_j}{std_j}$$

Where $\mu_j$ is the ensemble mean of component j and $std_j$ is the ensemble standard deviation of component j.

Accuracy

The Mapper Extension classifier is able to accurately predict the phase connectivities of 96% of the structures in the distribution network after measuring only 5% of them. This is a good accuracy for a small amount of labor. In practice, the accuracy will be even better. Since several structures will belong to the same feeder, it is easy to discover structures that have the same phase connectivity by analyzing the connectivity of the network itself. Thus, realistically, only a few secondaries need to be measured before applying this method to achieve high accuracy.

For testing purposes, training data was sampled at random from the set of all data. Realistically, this training data would be measured with synchrophasors or one of the other physical methods referenced in the literature review. The accuracy of the algorithm depends on the training data used. The reported values are averages over 10 trials of random training data. The optimal location of these training data points for accuracy remains an open question.

Once the training data is selected and the data is put in the form of a 744 dimensional vector, they are input into the Mapper Extension algorithm. The algorithm then builds the simplicial complex from the training data, and the rest of the data is classified accordingly. The output of the algorithm is a list of pairs (id,phase), one for each customer, where id is a unique identification number for that customer.

Influence of the Mapper Extension on the Results

Figure 12:
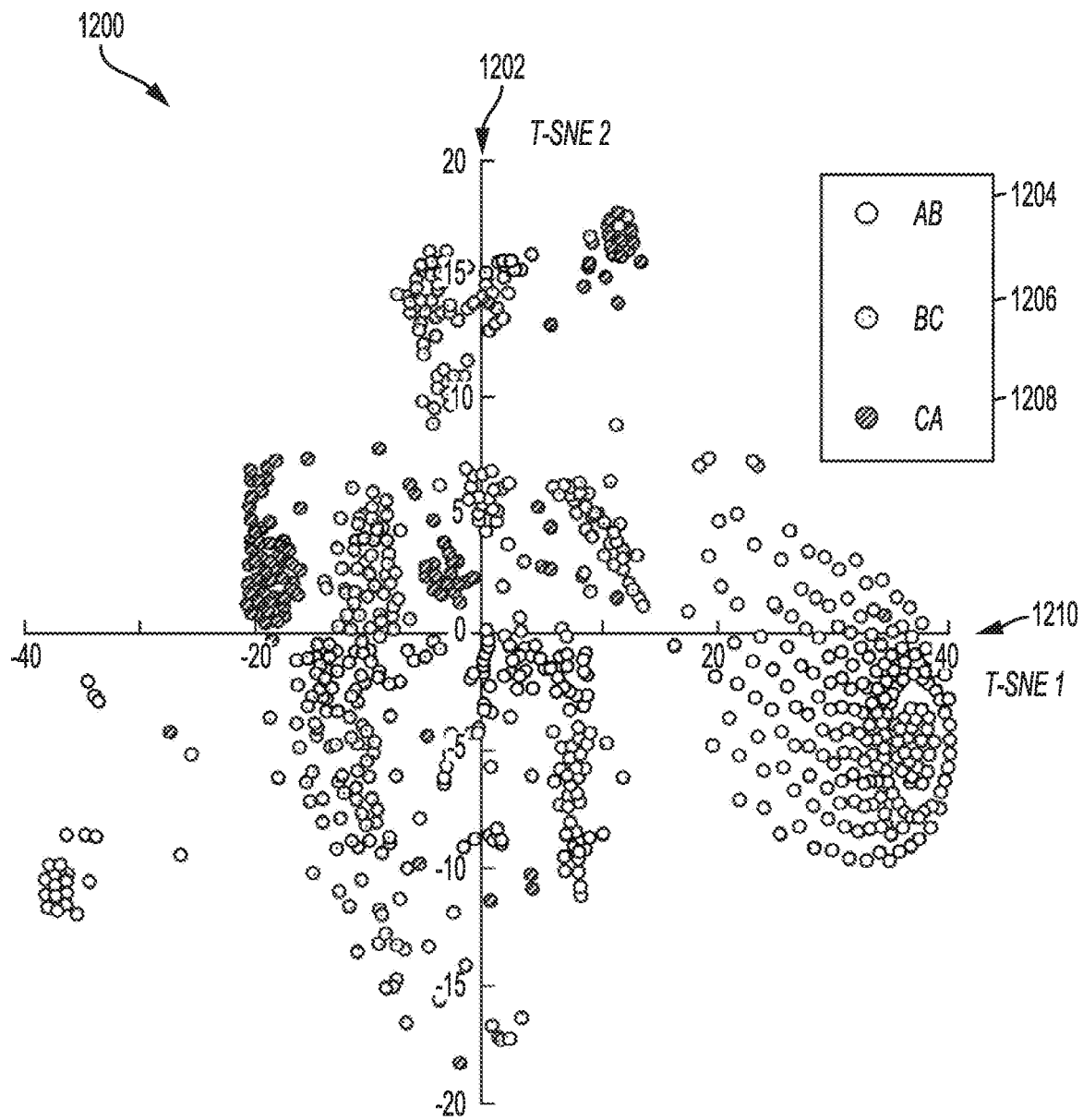
FIG. 12 illustrates an image of a data set under a filter function at 5% training data, in accordance with some embodiments.

FIG. 12 illustrates an image 1200 of a data set under a filter function at 5% training data, in accordance with some embodiments. In some embodiments, it is important to check that the Mapper Extension is responsible for this accuracy and not just the metric and filter function. Indeed, the metric and filter function alone give rise to image 1200 in FIG. 12, which appears to separate the data points into classes (see, e.g., class AB-1204, class BC-1206, and class CA-1208) fairly well. Nonetheless, the example groupings in the t-SNE space (see, e.g., t-SNE 1-1210 and t-SNE 2-1202) in image 1200 are rather complicated and may benefit in accuracy from the Mapper Extension.

To test this, an embodiment compared the full Mapper Extension to an algorithm that utilizes the metric change and the transformation to the filtered space. Specifically, the algorithm to be compared changes the metric, transforms the data into the t-SNE space, and then uses a k-means nearest neighbor algorithm to classify the test data. This procedure is labeled as the filtered Nearest Neighbor classifier for reference in the present disclosure. Certain embodiments also compared the accuracy of the Mapper Extension to plain Nearest Neighbors in the unfiltered space. The nearest neighbor algorithms were implemented with Python's Sklearn library.

Figure 13:
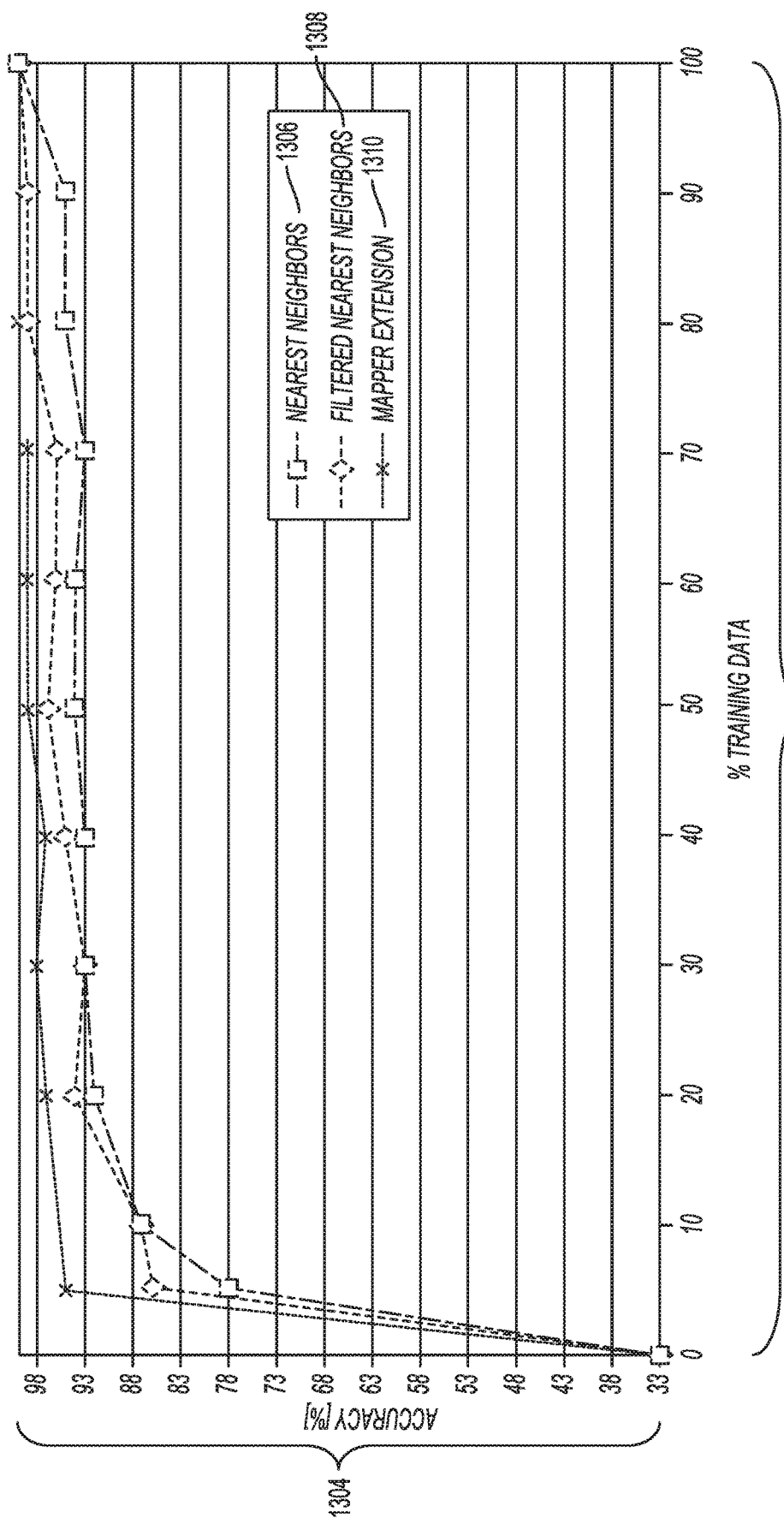
FIG. 13 depicts a comparison between a Mapper extension, a Nearest Neighbors algorithm, and the Nearest Neighbors algorithm in a filtered space, in accordance with some embodiments.

In an embodiment, both algorithms were run on the same data set at varying percentages of training data. FIG. 13 depicts a comparison between a Mapper extension 1310, a Nearest Neighbors algorithm 1306, and the Nearest Neighbors algorithm in a filtered space 1308, in accordance with some embodiments.

The example results of these trials are plotted in FIG. 13. FIG. 13 plots three lines in terms of respective percentages of training data 1302 and accuracy 1304. Line 1310 represents the accuracy of the Mapper Extension algorithm. Line 1306 is that of the unfiltered Nearest Neighbors algorithm and line 1308 is that of the filtered Nearest Neighbors algorithm. As shown in FIG. 13, filtering yields a small improvement in accuracy 1304 over the unfiltered case, but the Mapper Extension brings about the largest jump in accuracy.

As shown in FIG. 13, at 10% and 5% training data 1302, the Mapper Extension outperforms the Nearest Neighbor algorithms by a huge margin as measured in percentage of accuracy 1304. Thus, the true value of the Mapper Extension is that it performs much better than traditional machine learning algorithms when the training data 1302 is limited. As depicted in FIG. 13, this value decreases as more training data 1302 becomes available.

Aside from the improvement in accuracy, Mapper still gives the visualization properties discussed above. With this visualization, making improvements to the metric and filter is a simple process. If this particular pair of metric and filter function did not perform well on a new data set, then the Mapper visualization could be used to improve them on the fly. This visualization will also allow us to quickly decide if a particular random trial of the algorithm should be trusted or if a new random trial should be run. The number on each node is the number of points in the associated open covering in $C_X$.

Example Results with More Complicated Circuits

As described herein, certain embodiments use an extension of the Mapper algorithm in TDA to a classification problem. In particular, it described how to train the simplicial complex output from Mapper with training data. It also described how to classify new data points using this trained simplicial complex. It then established a method of quickly visualizing the confidence that certain embodiments should put into results and explained how this may be used to choose the parameters of the Mapper algorithm for improvements. Using real distribution network data provided by an electrical utility, it was shown that this algorithm, unlike standard classification algorithms, accurately identifies phase connectivity even when less than 5% of the data is used to train the complex. Certain embodiments further showed that this accuracy at low-level training data does indeed result from the Mapper extension and not just from the steps used to train the complex.

On more complicated circuits, however, accuracy may be lower for some of the algorithms. For circuits involving only line-to-line connections, however, embodiments implemented with the Mapper Extension provide an excellent tradeoff between the manual labor and costs of measuring phase connectivities and accuracy.

Abstract Simplicial Complexes

As would be understood by one skilled in the relevant art(s), an abstract simplicial complex $\Sigma$ is a set of subsets $\sigma$ of a finite set A with just one axiom. 1) If $\sigma \in \Sigma$, then all subsets of $\sigma$ are also in $\Sigma$. $\emptyset$ is included in $\Sigma$ because it is a subset of every set. For example, Let A={a, b, c}. A simplicial complex may be built from the subsets of A. The set {$\emptyset$, {a}, {b}, {c}, {a, b}} is a simplicial complex.

In this example, the underlying set A is called the vertex set of the simplicial complex. A subset $\sigma \in \Sigma$ of cardinality (n+1) is called an n-simplex and all subsets of $\sigma$ are called the faces of σ. If the underlying set is not explicitly given then the vertex set is just the set of all elements that appear in any subset σ. The vertex set is denoted as $\Sigma^0$ in this case.

The notion of simplicial complex is a generalization of that of a graph. In the example case where the largest simplex in the complex is a 1-simplex, a graph may be formed naturally by taking the graph vertices to be the vertex set of the complex and the graph edges to be the 1-simplices of the complex. Likewise, there is a natural way to encode any graph as a simplicial complex of this form.

There exists another notion of simplicial complex that is commonly used as definition. It is essentially a geometric version of the same idea, and it is easy to map from this form to the abstract form and vice versa. In certain embodiments, a simplicial complex refers to an abstract simplicial complex as described above.

The weak topology is a natural way to restrict a topological space to a subset. If $\Gamma$ is the original space and $\gamma \subseteq \Gamma$ the open sets of the weak topology on $\gamma$ are the sets V such that $V = \gamma \cap U$ where U is an open set of $\Gamma$. For example, consider $R^2$ endowed with the Euclidean topology and let S1 be the unit circle. Since $S^1 \subseteq R^2$, we can endow it with the weak topology by taking the intersections of the open sets of $R^2$ with $S^1$. One such open set is the set {(cos θ, sin θ): $-!a < \theta < a$, $a < \pi/2$} as this set is the intersection of $S^1$ and an open ball centered at (1, 0) with radius $\sqrt{2(1-\cos a)}$.

Open Coverings and Nerves

As would be understood by one skilled in the relevant art(s), an open covering of a topological space X is an indexed collection of open sets $\{U_\alpha\}_{\alpha \in J}$ such that the following condition holds: $X \subseteq \cup_{\alpha \in J} U_\alpha$.

The nerve of an open covering, N, is a simplicial complex representing the structure of that covering. The nerve's simplices are formed from subsets of the indexing set J of the open cover. Explicitly, if $Q \subseteq J$, then Q is placed in N if the following conditions are met:

$$Q \neq \emptyset \qquad \qquad 1)$$

$$(\forall \alpha \in Q), U_\alpha \neq \emptyset \qquad \qquad 2)$$

$$(\forall \alpha, \beta \in Q), U_\alpha \cup U_\beta \neq \emptyset \qquad \qquad 3)$$

Example Software Architecture

Figure 14:
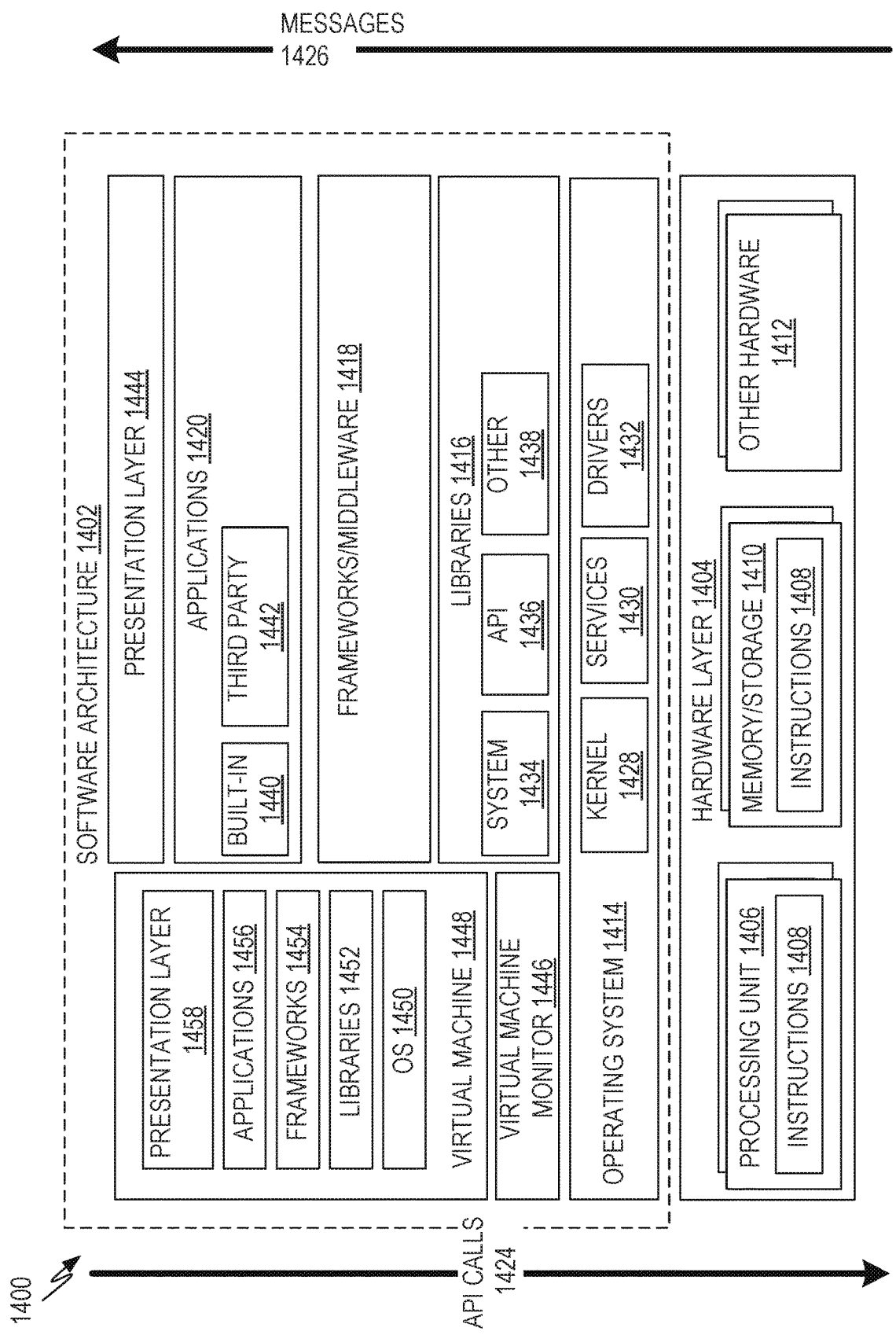
FIG. 14 is a block diagram illustrating a representative software architecture, which may be used in conjunction with various hardware architectures herein described.

FIG. 14 is a block diagram 1400 illustrating a representative software architecture 1402, which may be used in conjunction with various hardware architectures herein described. FIG. 14 is merely a non-limiting example of a software architecture, and it will be appreciated that many other architectures may be implemented to facilitate the functionality described herein. The software architecture 1402 may be executing on hardware such as a machine 1500 of FIG. 15 that includes, among other things, processors 1510, memory/storage 1530, and I/O components 1550. A representative hardware layer 1404 is illustrated and can represent, for example, the machine 1500 of FIG. 15. The representative hardware layer 1404 comprises one or more processing units 1406 having associated executable instructions 1408. The executable instructions 1408 represent the executable instructions of the software architecture 1402, including implementation of the systems, methods, algorithms, visualizations, modules, and so forth of FIGS. 1-13. The hardware layer 1404 also includes memory and/or storage modules 1410, which also have the executable instructions 1408. The hardware layer 1404 may also comprise other hardware 1412, which represents any other hardware of the hardware layer 1404, such as the other hardware illustrated as part of the machine 1500.

In the example architecture of FIG. 14, the software architecture 1402 may be conceptualized as a stack of layers where each layer provides particular functionality. For example, the software architecture 1402 may include layers such as an operating system 1414, libraries 1416, frameworks/middleware 1418, applications 1420, and a presentation layer 1444. Operationally, the applications 1420 and/or other components within the layers may invoke API calls 1424 through the software stack and receive responses, returned values, and so forth, illustrated as API calls 1426 (e.g., messages), in response to the API calls 1424. The layers illustrated are representative in nature and not all software architectures have all layers. For example, some mobile or special-purpose operating systems may not provide a layer of frameworks/middleware 1418, while others may provide such a layer. Other software architectures may include additional or different layers.

The operating system 1414 may manage hardware resources and provide common services. The operating system 1414 may include, for example, a kernel 1428, services 1430, and drivers 1432. The kernel 1428 may act as an abstraction layer between the hardware and the other software layers. For example, the kernel 1428 may be responsible for memory management, processor management (e.g., scheduling), component management, networking, security settings, and so on. The services 1430 may provide other common services for the other software layers. The drivers 1432 may be responsible for controlling or interfacing with the underlying hardware. For instance, the drivers 1432 may include display drivers, camera drivers, Bluetooth® drivers, flash memory drivers, serial communication drivers (e.g., Universal Serial Bus (USB) drivers), Wi-Fi® drivers, audio drivers, power management drivers, and so forth depending on the hardware configuration.

The libraries 1416 may provide a common infrastructure that may be utilized by the applications 1420 and/or other components and/or layers. The libraries 1416 typically provide functionality that allows other software modules to perform tasks in an easier fashion than by interfacing directly with the underlying operating system 1414 functionality (e.g., kernel 1428, services 1430, and/or drivers 1432). The libraries 1416 may include system libraries 1434 (e.g., C standard library) that may provide functions such as memory allocation functions, string manipulation functions, mathematic functions, and the like. In addition, the libraries 1416 may include API libraries 1436 such as media libraries (e.g., libraries to support presentation and manipulation of various media formats such as MPEG4, H.264, MP3, AAC, AMR, JPG, PNG), graphics libraries (e.g., an OpenGL framework that may be used to render 2D and 3D graphic content on a display), database libraries (e.g., SQLite that may provide various relational database functions), web libraries (e.g., WebKit that may provide web browsing functionality), and the like. The libraries 1416 may also include a wide variety of other libraries 1438 to provide many other APIs to the applications 1420 and other software components/modules.

The frameworks 1418 (also sometimes referred to as middleware) may provide a higher-level common infrastructure that may be utilized by the applications 1420 and/or other software components/modules. For example, the frameworks 1418 may provide various graphic user interface (GUI) functions (e.g., GUI functions to present visualizations, plots, and outputs such as those shown in the examples of FIGS. 3-5, 8-10, 12, and 13), high-level resource management, high-level location services, and so forth. The frameworks 1418 may provide a broad spectrum of other APIs that may be utilized by the applications 1420 and/or other software components/modules, some of which may be specific to a particular operating system or platform.

The applications 1420 include built-in applications 1440 and/or third-party applications 1442. Examples of representative built-in applications 1440 may include, but are not limited to, a contacts application, a browser application, a book reader application, a location application, a media application, a messaging application, and/or a game application. The third-party applications 1442 may include any of the built-in applications 1440 as well as a broad assortment of other applications. In a specific example, the third-party application 1442 (e.g., an application developed using the Android™ or iOS™ software development kit (SDK) by an entity other than the vendor of the particular platform) may be mobile software running on a mobile operating system such as iOS™, Android™, Windows® Phone, or other mobile operating systems. In this example, the third-party application 1442 may invoke the API calls 1424 provided by the mobile operating system such as the operating system 1414 to facilitate functionality described herein.

The applications 1420 may utilize built-in operating system 1414 functions (e.g., kernel 1428, services 1430, and/or drivers 1432), libraries 1416 (e.g., system libraries 1434, API libraries 1436, and other libraries 1438), and frameworks/middleware 1418 to create user interfaces to interact with users of the system. Alternatively, or additionally, in some systems, interactions with a user may occur through a presentation layer, such as the presentation layer 1444. In these systems, the application/module 'logic' may be separated from the aspects of the application/module that interact with a user.

Some software architectures utilize virtual machines. In the example of FIG. 14, this is illustrated by a virtual machine 1448. A virtual machine creates a software environment where applications/modules can execute as if they were executing on a hardware machine (such as the machine 1500 of FIG. 15, for example). A virtual machine is hosted by a host operating system (e.g., operating system 1414 in FIG. 14) and typically, although not always, has a virtual machine monitor 1446, which manages the operation of the virtual machine 1448 as well as the interface with the host operating system (e.g., operating system 1414). A software architecture executes within the virtual machine 1448, such as an operating system 1450, libraries 1452, frameworks/middleware 1454, applications 1456, and/or a presentation layer 1458. These layers of software architecture executing within the virtual machine 1448 may be the same as corresponding layers previously described or may be different.

Example Architecture and Machine-Readable Medium

Figure 15:
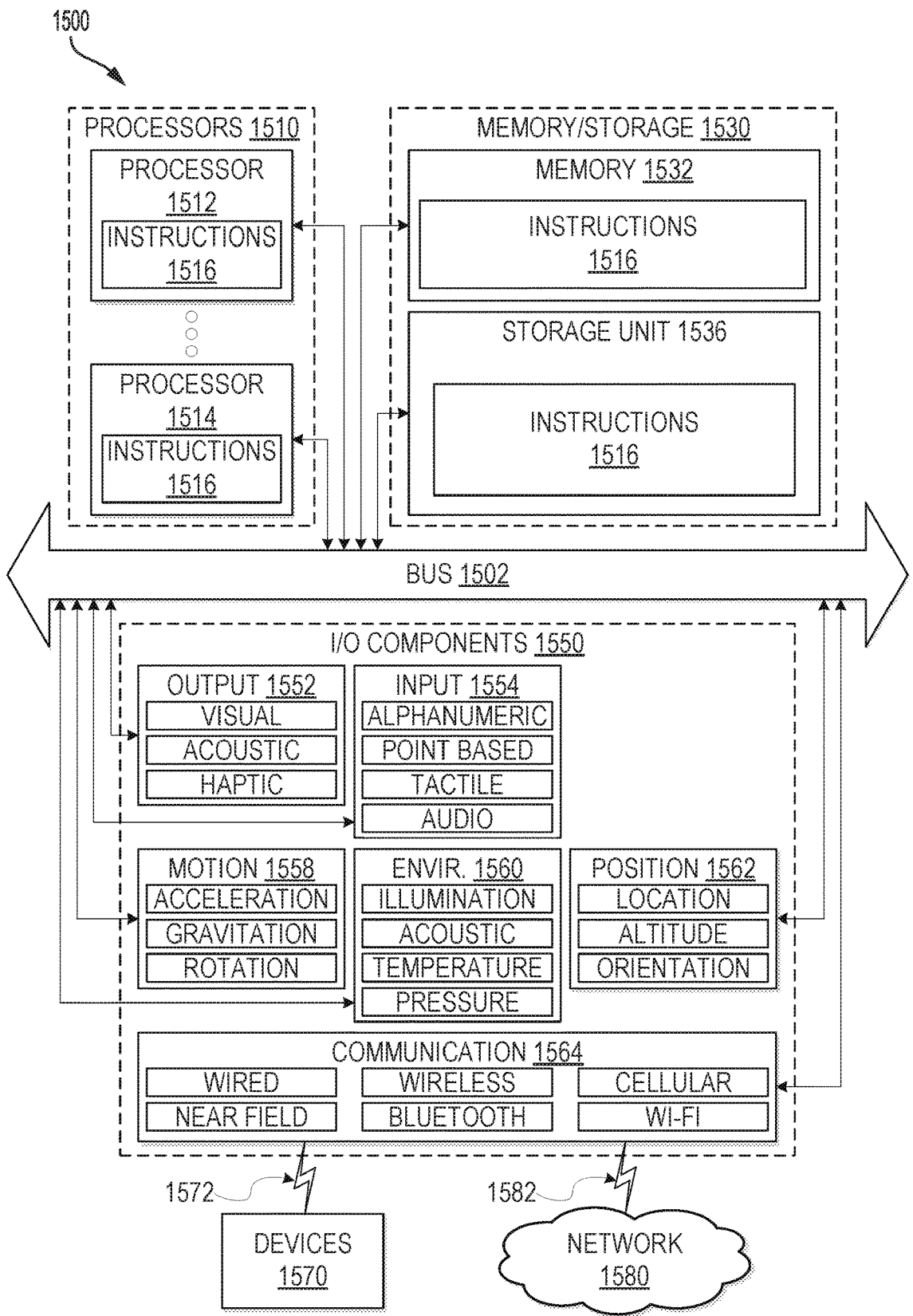
FIG. 15 is a block diagram illustrating components of a machine, according to some example embodiments, able to read instructions from a machine-readable medium (e.g., a machine-readable storage medium) and perform any one or more of the methodologies discussed herein.

FIG. 15 is a block diagram illustrating components of a machine 1500, according to some example embodiments, able to read instructions from a machine-readable medium (e.g., a machine-readable storage medium) and perform any one or more of the methodologies discussed herein. Specifically, FIG. 15 shows a diagrammatic representation of the machine 1500 in the example form of a computer system, within which instructions 1516 (e.g., software, a program, an application, an applet, an app, or other executable code) for causing the machine 1500 to perform any one or more of the methodologies discussed herein may be executed (e.g., phase identification methods). The instructions 1516 transform the general, non-programmed machine into a particular machine programmed to carry out the described and illustrated functions in the manner described. In alternative embodiments, the machine 1500 operates as a standalone device or may be coupled (e.g., networked) to other machines. In a networked deployment, the machine 1500 may operate in the capacity of a server machine or a client machine in a server-client network environment, or as a peer machine in a peer-to-peer (or distributed) network environment. The machine 1500 may comprise, but not be limited to, a server computer, a client computer, a PC, a tablet computer, a laptop computer, a netbook, a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1516, sequentially or otherwise, that specify actions to be taken by the machine 1500. Further, while only a single machine 1500 is illustrated, the term 'machine' shall also be taken to include a collection of machines 1500 that individually or jointly execute the instructions 1516 to perform any one or more of the methodologies discussed herein (e.g., phase identification—including phase identification through TDA).

The machine 1500 may include processors 1510, memory/storage 1530, and I/O components 1550, which may be configured to communicate with each other such as via a bus 1502. In an example embodiment, the processors 1510 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, a processor 1512 and a processor 1514 that may execute the instructions 1516. The term 'processor' is intended to include multi-core processors that may comprise two or more independent processors (sometimes referred to as 'cores') that may execute instructions contemporaneously. Although FIG. 15 shows multiple processors 1510, the machine 1500 may include a single processor with a single core, a single processor with multiple cores (e.g., a multi-core processor), multiple processors with a single core, multiple processors with multiples cores, or any combination thereof.

The memory/storage 1530 may include a memory 1532, such as a main memory, or other memory storage, and a storage unit 1536, both accessible to the processors 1510 such as via the bus 1502. The storage unit 1536 and memory 1532 store the instructions 1516 embodying any one or more of the methodologies or functions described herein. The instructions 1516 may also reside, completely or partially, within the memory 1532, within the storage unit 1536, within at least one of the processors 1510 (e.g., within the processor's cache memory), or any suitable combination thereof, during execution thereof by the machine 1500. Accordingly, the memory 1532, the storage unit 1536, and the memory of the processors 1510 are examples of machine-readable media.

As used herein, 'machine-readable medium' means a device able to store instructions and data temporarily or permanently and may include, but is not limited to, random-access memory (RAM), read-only memory (ROM), buffer memory, flash memory, optical media, magnetic media, cache memory, other types of storage (e.g., Erasable Programmable Read-Only Memory (EEPROM)), and/or any suitable combination thereof. The term 'machine-readable medium' should be taken to include a single medium or multiple media (e.g., a centralized or distributed database, or associated caches and servers) able to store the instructions

1516. The term 'machine-readable medium' shall also be taken to include any medium, or combination of multiple media, that is capable of storing instructions (e.g., instructions 1516) for execution by a machine (e.g., machine 1500), such that the instructions, when executed by one or more processors of the machine (e.g., processors 1510), cause the machine to perform any one or more of the methodologies described herein. Accordingly, a 'machine-readable medium' refers to a single storage apparatus or device, as well as 'cloud-based' storage systems or storage networks that include multiple storage apparatus or devices. The term 'machine-readable medium' excludes signals per se.

The I/O components 1550 may include a wide variety of components to receive input, provide output, produce output, transmit information, exchange information, capture measurements, and so on. The specific I/O components 1550 that are included in a particular machine will depend on the type of machine. For example, portable machines such as mobile phones will likely include a touch input device or other such input mechanisms, while a headless server machine will likely not include such a touch input device. It will be appreciated that the I/O components 1550 may include many other components that are not shown in FIG. 15. The I/O components 1550 are grouped according to functionality merely for simplifying the following discussion and the grouping is in no way limiting. In various example embodiments, the I/O components 1550 may include output components 1552 and input components 1554.

The output components 1552 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The output components may be used to present visualizations, plots, and outputs such as those shown in the examples of FIGS. 3-5, 8-10, 12, and 13. The input components 1554 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1550 may include motion components 1558, environmental components 1560, or position components 1562, among a wide array of other components. The motion components 1558 may include acceleration sensor components (e.g., accelerometer), gravitation sensor components, rotation sensor components (e.g., gyroscope), and so forth.

The environmental components 1560 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detect concentrations of hazardous gases for safety or to measure pollutants in the atmosphere), or other components that may provide indications, measurements, or signals corresponding to a surrounding physical environment. The position components 1562 may include location sensor components (e.g., a Global Position System (GPS) receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1550 may include communication components 1564 operable to couple the machine 1500 to a network 1580 or devices 1570 via a coupling 1582 and a coupling 1572, respectively. For example, the communication components 1564 may include a network interface component or other suitable device to interface with the network 1580. In further examples, the communication components 1564 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1570 may be another machine or any of a wide variety of peripheral devices (e.g., a peripheral device coupled via a USB).

Moreover, the communication components 1564 may detect identifiers or include components operable to detect identifiers. For example, the communication components 1564 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1564, such as location via Internet Protocol (IP) geolocation, location via Wi-Fi® signal triangulation, location via detecting an NFC beacon signal that may indicate a particular location, and so forth.

Example Transmission Medium

In various example embodiments, one or more portions of the network 1580 may be an ad hoc network, an intranet, an extranet, a virtual private network (VPN), a local area network (LAN), a wireless LAN (WLAN), a WAN, a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, the network 1580 or a portion of the network 1580 may include a wireless or cellular network and the coupling 1582 may be a Code Division Multiple Access (CDMA) connection, a Global System for Mobile communications (GSM) connection, or another type of cellular or wireless coupling. In this example, the coupling 1582 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third-Generation Partnership Project (3GPP) including 3G, fourth-generation wireless (4G) networks, Universal Mobile Telecommunications System (UMTS), High-Speed Packet Access (HSPA), Worldwide Interoperability for Microwave Access (WiMAX), Long-Term Evolution (LTE) standard, others defined by various standard-setting organizations, other long-range protocols, or other data transfer technology.

The instructions 1516 may be transmitted or received over the network 1580 using a transmission medium via a network interface device (e.g., a network interface component included in the communication components 1564) and utilizing any one of a number of well-known transfer protocols (e.g., HTTP). Similarly, the instructions 1516 may be transmitted or received using a transmission medium via the coupling 1572 (e.g., a peer-to-peer coupling) to the devices 1570. The term 'transmission medium' shall be taken to include any intangible medium that is capable of storing, encoding, or carrying the instructions 1516 for execution by the machine 1500, and includes digital or analog communications signals or other intangible media to facilitate communication of such software.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term 'invention' merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term 'or' may be construed in either an inclusive or an exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

EXAMPLES

The following examples pertain to further embodiments. To better illustrate the method and apparatuses disclosed herein, a non-limiting list of examples is provided here:

Example 1 is a method of phase identification, comprising: receiving voltage measurements, the voltage measurements including a plurality of customer voltage time series; obtaining distribution connectivity information: normalizing the plurality of customer voltage time series by their respective standard deviations; defining constraints for a clustering process by inspecting the distribution connectivity information; applying constrained and unconstrained clustering to partition customers into a plurality of clusters; and identifying a phase of each of the plurality of clusters by solving a minimization problem.

In Example 2, the subject matter of Example 1 includes, wherein the receiving comprises receiving the voltage measurements from a plurality of smart meters in an electric distribution system.

In Example 3, the subject matter of Examples 1-2 includes, wherein the receiving comprises receiving the voltage measurements from a supervisory control and data acquisition (SCADA) system.

In Example 4, the subject matter of Examples 1-3 includes, wherein the obtaining comprises retrieving the distribution connectivity information from an electrical power utility operating an electric distribution system.

In Example 5, the subject matter of Examples 1-4 includes, wherein the normalizing comprises applying one or more of a linear dimensionality reduction technique and a non-linear dimensionality reduction technique.

In Example 6, the subject matter of Example 5 includes, wherein the linear dimensionality reduction technique comprises applying principal component analysis (PCA) to extract key components from the plurality of customer voltage time series.

In Example 7, the subject matter of Example 6 includes, wherein extracting the key components comprises applying PCA on normalized customer voltage time series to extract the top n components as the key components.

In Example 8, the subject matter of Examples 5-7 includes, wherein the non-linear dimensionality reduction technique comprises applying one or more of Sammon mapping, curvilinear components analysis, Isomap, and t-distributed stochastic neighbor embedding to extract key features from the plurality of customer voltage time series.

In Example 9, the subject matter of Examples 1-8 includes, causing display of one or more of the identified phase of the plurality of clusters on a display device.

Example 10 is a system comprising: a computer-readable medium having instructions stored thereon, which, when executed by a processor, cause the system to: receive voltage measurements, the voltage measurements including a plurality of customer voltage time series; obtain distribution connectivity information; normalize the plurality of customer voltage time series by their respective standard deviations; define constraints for a clustering process by inspecting the distribution connectivity information; apply constrained clustering to partition customers into a plurality of clusters; and identify a phase of each of the plurality of clusters by solving a minimization problem.

In Example 11, the subject matter of Example 10 includes, wherein the receiving comprises receiving the voltage measurements from a plurality of smart meters associated with respective customers of an electrical power utility.

In Example 12, the subject matter of Examples 10-11 includes, wherein the receiving comprises receiving the voltage measurements from a supervisory control and data acquisition (SCADA) system.

In Example 13, the subject matter of Examples 10-12 includes, wherein the obtaining comprises retrieving the distribution connectivity information from an electrical power utility operating an electric distribution system.

In Example 14, the subject matter of Examples 10-13 includes, wherein the normalizing comprises applying one or more of a linear dimensionality reduction technique and a non-linear dimensionality reduction technique.

Example 15 is a non-transitory machine-readable storage medium comprising instructions, which when implemented by one or more machines, cause the one or more machines to perform operations for phase identification topological data analysis (TDA), the operations comprising: obtaining data, the data including voltage measurements and training data; building, based on the training data, a forest of random trees; transforming each data point in the voltage measurements into a respective forest vector; running t-Distributed Stochastic Neighbor Embedding (t-SNE) dimensionality reduction algorithm to produce numerical results for each data point; storing, on the non-transitory machine-readable storage medium, the numerical results in a table representing a filter function; building a base simplicial complex by inputting the training data into a Mapper algorithm; for each data point in the voltage measurements: classifying new data by filtering the data point; considering open sets in a covering that the data point lands in; grouping the data point to a nearest trained cluster; and labelling the nearest trained cluster.

In Example 16, the subject matter of Example 15 includes, wherein building the forest of random trees comprises forming a hamming metric to learn a distance metric.

In Example 17, the subject matter of Example 16 includes, wherein running the t-SNE dimensionality reduction algorithm comprises running the t-SNE algorithm with the hamming metric.

In Example 18, the subject matter of Examples 15-17 includes, wherein building the base simplicial complex comprises: filtering the training data; inverting open sets of a covering through the filter function; clustering inverse image subsets to form trained clusters; building a nerve of the covering; and causing display of a visualization of the base simplicial complex on a display device of one of the one or more machines.

Example 19 is an apparatus comprising memory and processing circuitry coupled to the memory, the processing circuitry configured to: obtain data, the data including voltage measurements and training data; build, based on the training data, a forest of random trees; transform each data point in the voltage measurements into a respective forest vector; run a t-Distributed Stochastic Neighbor Embedding (t-SNE) dimensionality reduction algorithm to produce numerical results for each data point; store, in the memory, the numerical results in a table representing a filter function; build a base simplicial complex by inputting the training data into a Mapper algorithm; for each data point in the voltage measurements: classify new data by filtering the data point; consider open sets in a covering that the data point lands in; group the data point to a nearest trained cluster; and label the nearest trained cluster.

In Example 20, the subject matter of Example 19 includes, wherein building the base simplicial complex comprises: filtering the training data; inverting open sets of a covering through the filter function; clustering inverse image subsets to form trained clusters; building a nerve of the covering; and causing display of a visualization of the base simplicial complex on a display device.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

What is claimed is:

1. A method of phase identification, comprising:
    receiving voltage measurements from a plurality of smart meters installed to capture and automatically transfer data to a central database which oversees the smart meters, the voltage measurements including a plurality of customer voltage time series data;
    obtaining distribution connectivity information;
    normalizing the plurality of customer voltage time series data by their respective standard deviations;
    defining constraints for a clustering process by inspecting the distribution connectivity information;
    applying constrained and unconstrained clustering to partition customer data into a plurality of clusters;
    identifying a phase of each of the plurality of clusters by solving a minimization problem with a one-to-one matching between the plurality of clusters and a set of possible phase connections; and
    generating a distribution circuit map wherein identified phases are separately coded; and
    managing the distribution system using the generated map for the three-phase power flow control, three-phase optimal power flow control, distribution system restoration and/or distribution network reconfiguration.

2. The method of claim 1, wherein the receiving comprises receiving the voltage measurements from a plurality of smart meters in an electric distribution system.

3. The method of claim 1, wherein the receiving comprises receiving the voltage measurements from a supervisory control and data acquisition (SCADA) system.

4. The method of claim 1, wherein the obtaining comprises retrieving the distribution connectivity information from an electrical power utility company operating an electric distribution system.

5. The method of claim 1, wherein the normalizing comprises applying one or more of a linear dimensionality reduction technique and a non-linear dimensionality reduction technique.

6. The method of claim 5, wherein the linear dimensionality reduction technique comprises applying principal component analysis (PCA) to extract key components from the plurality of customer voltage time series data.

7. The method of claim 6, wherein extracting the key components comprises applying PCA on normalized customer voltage time series data to extract the top n components as the key components.

8. The method of claim 5, wherein the non-linear dimensionality reduction technique comprises applying one or more of Sammon mapping, curvilinear components analysis, Isomap, and t-distributed stochastic neighbor embedding to extract key features from the plurality of customer voltage time series data.

9. A system comprising:
a computer-readable medium having instructions stored thereon, which, when executed by a processor, cause the system to:
receive voltage measurements from a plurality of smart meters installed to capture and automatically transfer data to a central database which oversees the smart meters, the voltage measurements including a plurality of customer voltage time series data;
obtain distribution connectivity information;
normalize the plurality of customer voltage time series data by their respective standard deviations;
define constraints for a clustering process by inspecting the distribution connectivity information;
apply constrained clustering to partition customer data into a plurality of clusters;
identify a phase of each of the plurality of clusters by solving a minimization problem with a one-to-one matching between the plurality of clusters and a set of possible phase connections;
generate a distribution circuit map wherein identified phases are separately coded; and
manage the distribution system using the generated map for the three-phase power flow control, three-phase optimal power flow control, distribution system restoration and/or distribution network reconfiguration.

10. The system of claim 9, wherein the receiving comprises receiving the voltage measurements from a plurality of smart meters associated with respective customers of an electrical power utility company.

11. The system of claim 9, wherein the receiving comprises receiving the voltage measurements from a supervisory control and data acquisition (SCADA) system.

12. The system of claim 9, wherein the obtaining comprises retrieving the distribution connectivity information from an electrical power utility company operating an electric distribution system.

13. The system of claim 9, wherein the normalizing comprises applying one or more of a linear dimensionality reduction technique and a non-linear dimensionality reduction technique.

* * * * *